United States Patent
Feng et al.

(10) Patent No.: US 10,580,376 B2
(45) Date of Patent: Mar. 3, 2020

(54) SHIFT REGISTER AND DRIVING METHOD THEREOF, GATE DRIVING CIRCUIT AND DISPLAY APPARATUS

(71) Applicants: BOE Technology Group Co., Ltd., Beijing (CN); Hefei BOE Optoelectronics Technology Co., Ltd., Hefei (CN)

(72) Inventors: Silin Feng, Beijing (CN); Hongmin Li, Beijing (CN); Ping Song, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/520,965

(22) PCT Filed: Jan. 22, 2016

(86) PCT No.: PCT/CN2016/071784
§ 371 (c)(1),
(2) Date: Apr. 21, 2017

(87) PCT Pub. No.: WO2017/036077
PCT Pub. Date: Mar. 9, 2017

(65) Prior Publication Data
US 2017/0358267 A1  Dec. 14, 2017

(30) Foreign Application Priority Data

Aug. 28, 2015 (CN) .......................... 2015 1 0544007

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G09G 3/3648* (2013.01); *G11C 19/28* (2013.01);
(Continued)

(58) Field of Classification Search
None
See application file for complete search history.

(56) References Cited

U.S. PATENT DOCUMENTS

| 8,766,958 B2 * | 7/2014 | Zhang ................ G09G 3/3677 |
| | | 345/204 |
| 2008/0101529 A1 * | 5/2008 | Tobita ................ G09G 3/3677 |
| | | 377/64 |

(Continued)

FOREIGN PATENT DOCUMENTS

| CN | 1941062 A | 4/2007 |
| CN | 1941063 A | 4/2007 |

(Continued)

OTHER PUBLICATIONS

May 27, 2016—International Search Report and Written Opinion Appn PCT/CN2016/071784 with Eng Tran.

(Continued)

*Primary Examiner* — Tuan T Lam
(74) *Attorney, Agent, or Firm* — Banner & Witcoff, Ltd.

(57) ABSTRACT

A shift register and driving method thereof, a gate driving circuit and a display apparatus are provided. The shift register includes an input unit, a reset unit, a first control unit, a second control unit, a first output unit, a second output unit, a first signal output end and a second signal output end. Potential of the first signal output end is controlled by use of the input unit, the reset unit, the first control unit and the first output unit, and potential of the second signal output end is controlled by use of the input unit, the reset unit, the second control unit and the second output unit. The first control unit (Continued)

and the first output unit, the second control unit and the second output unit are utilized for controlling and sharing the input unit and the reset unit so that function of two shift register units are realized.

16 Claims, 10 Drawing Sheets

(52) U.S. Cl.
CPC ... *G11C 19/287* (2013.01); *G09G 2310/0286* (2013.01); *G09G 2310/08* (2013.01)

(56) References Cited

U.S. PATENT DOCUMENTS

| | | | |
|---|---|---|---|
| 2008/0219401 A1* | 9/2008 | Tobita | G09G 3/3677 377/79 |
| 2014/0010341 A1 | 1/2014 | Wu et al. | |
| 2014/0253424 A1* | 9/2014 | Yu | G11C 19/28 345/100 |
| 2015/0002382 A1* | 1/2015 | Cao | G09G 3/3677 345/92 |
| 2015/0016584 A1* | 1/2015 | Dun | G11C 27/04 377/68 |
| 2015/0043703 A1* | 2/2015 | Tan | G11C 19/28 377/68 |
| 2015/0109353 A1* | 4/2015 | Yu | G11C 19/28 345/691 |
| 2016/0365034 A1* | 12/2016 | Chan | G11C 19/28 |
| 2017/0018244 A1* | 1/2017 | Jen | G09G 3/3677 |
| 2017/0025079 A1* | 1/2017 | Feng | G09G 3/3648 |
| 2017/0249916 A1* | 8/2017 | Jen | G09G 3/3677 |
| 2017/0285374 A1* | 10/2017 | Li | G02F 1/1303 |

FOREIGN PATENT DOCUMENTS

| | | |
|---|---|---|
| CN | 101312019 A | 11/2008 |
| CN | 103187037 A | 7/2013 |
| CN | 103489483 A | 1/2014 |
| CN | 103985363 A | 8/2014 |
| CN | 104835476 A | 8/2015 |
| CN | 105096889 A | 11/2015 |
| KR | 20140079106 A | 6/2014 |

OTHER PUBLICATIONS

Mar. 31, 2017—(CN) First Office Action 201510544007.4 with Eng Tran.
Sep. 1, 2017—(CN) Second Office Action Appn 201510544007.4 with English Tran.

* cited by examiner

SHIFT REGISTER AND DRIVING METHOD THEREOF, GATE DRIVING CIRCUIT AND DISPLAY APPARATUS

The application is a U.S. National Phase Entry of International Application No. PCT/CN2016/071784 filed on Jan. 22, 2016, designating the United States of America and claiming priority to Chinese Patent Application No. 201510544007.4 filed on Aug. 28, 2015. The present application claims priority to and the benefit of the above-identified applications and the above-identified applications are incorporated by reference herein in their entirety.

TECHNICAL FIELD

The present disclosure relates to a shift register, a driving method thereof, a gate driving circuit and a display apparatus.

BACKGROUND

In the thin film transistor display, a gate driving signal is generally provided to gates of respective thin film transistors (TFT) of a pixel region through a gate driving circuit. The gate driving circuit can be formed on an array substrate of a liquid crystal display through array process, i.e., gate driver on array (GOA) process. Such integration process not only saves cost, but also has an artistic design where two sides of the liquid crystal panel are symmetrical. At the same time, it saves wiring space of bonding area and fan-out of a gate integrated circuit (IC), so that a design of narrow frame can be realized; furthermore, such integration process can save bonding process in a direction of gate scanning line, so that productivity and yield rate are raised.

The existing gate driving circuit is usually constituted of a plurality of shift registers connected in cascades. Each stage of shift registers is corresponding to one gate line, so that the gate driving circuit scans respective gate lines through respective stages of shift registers respectively. However, in the existing gate driving circuit, each stage of shift register comprises a plurality of switch transistors and occupies a large area, which is disadvantageous for the design of narrow frame.

Therefore, how to provide a gate driving circuit being beneficial for the design of narrow frame is a technical problem that urgently needs to be solved.

SUMMARY

There are provided in embodiments of the present disclosure a shift register, a driving method thereof, a gate driving circuit and a display apparatus, which are used to provide a gate driving circuit being beneficial for a design of narrow frame.

There is provided a shift register in an embodiment of the present disclosure, comprising:

an input unit, whose output terminal is connected to a first node, configured to provide a first reference signal to the first node under control of an input signal;

a reset unit, whose output terminal is connected to the first node, configured to provide a second reference signal to the first node under control of a reset signal;

a first control unit, whose input terminal is connected to a first signal output terminal and output terminal is connected to a second node, configured to provide a first clock signal to the second node, and provide a direct current signal to the second node under control of a control of the first signal output terminal;

a second control unit, whose input terminal is connected to a second signal output terminal and output terminal is connected to a third node, configured to provide a second clock signal to the third node, and provide the direct current signal to the third node under control of a signal of the second signal output terminal;

a first output unit, whose one input terminal is connected to the first node and another input terminal is connected to the second node, configured to provide the first clock signal to the first signal output terminal under control of a potential of the first node, provide the direct current signal to the first signal output terminal under control of a potential of the second node, and provide the direct current signal to the first signal output terminal under control of the second clock signal;

a second output unit, whose one input terminal is connected to the first node and another input terminal is connected to the third node, configured to provide a second clock signal to the second signal output terminal under control of the potential of the first node, provide the direct current signal to the second signal output terminal under control of a potential of the third node, and provide the direct current signal to the second signal output terminal under control of the first clock signal;

wherein the first clock signal and the second clock signal are opposite in phase, and a potential of the first reference signal and a potential of the second reference signal are opposite.

In a possible implementation, in the shift register provided in the embodiment of the present disclosure, the input unit comprises: a first switch transistor; wherein a gate of the first switch transistor is used to receive the input signal, a source thereof is used to receive the first reference signal, and a drain thereof is connected to the first node.

In a possible implementation, in the shift register provided in the embodiment of the present disclosure, the reset unit comprises: a second switch transistor; wherein a gate of the second switch transistor is used to receive the reset signal, a source thereof is used to receive the second reference signal, and a drain thereof is connected to the first node.

In a possible implementation, in the shift register provided in the embodiment of the present disclosure, the first control unit comprises: a third switch transistor and a fourth switch transistor; wherein both a gate and a source of the third switch transistor are used to receive the first clock signal, and a drain thereof is connected to the second node;

a gate of the fourth switch transistor is connected to the first signal output terminal, a source thereof is used to receive the direct current signal, and a drain thereof is connected to the second node.

In a possible implementation, in the shift register provided in the embodiment of the present disclosure, the second control unit comprises: a fifth switch transistor and a sixth switch transistor; wherein both a gate and a source of the fifth switch transistor are used to receive the second clock signal, and a drain thereof is connected to the third node;

a gate of the sixth switch transistor is connected to the second signal output terminal, a source thereof is used to receive the direct current signal, and a drain thereof is connected to the third node.

In a possible implementation, in the shift register provided in the embodiment of the present disclosure, the first output unit comprises: a seventh switch transistor, an eighth switch transistor, a ninth switch transistor, and a first capacitor; wherein a gate of the seventh switch transistor is connected to the first node, a source thereof is used to receive the first clock signal, and a drain thereof is connected to the first signal output terminal;

a gate of the eighth switch transistor is connected to the second node, a source thereof is used to receive the direct current signal, and a drain thereof is connected to the first signal output terminal;

a gate of the ninth switch transistor is used to receive the second clock signal, a source thereof is used to receive the direct current signal, and a drain thereof is connected to the first signal output terminal; and the first capacitor is connected between the first node and the first signal output terminal.

In a possible implementation, in the shift register provided in the embodiment of the present disclosure, the second output unit comprises: a tenth switch transistor, an eleventh switch transistor, a twelfth switch transistor and a second capacitor; wherein a gate of the tenth switch transistor is connected to the first node, a source thereof is used to receive the second clock signal, and a drain thereof is connected to the second signal output terminal;

a gate of the eleventh switch transistor is connected to the third node, a source thereof is used to receive the direct current signal, and a drain thereof is connected to the second signal output terminal;

a gate of the twelfth switch transistor is used to receive the first clock signal, a source thereof is used to receive the direct current signal, and a drain thereof is connected to the second signal output terminal; and the second capacitor is connected between the first node and the second signal output terminal.

Alternatively, in the shift register provided in the embodiment of the present disclosure, all switch transistors are N type transistors, and a potential of the direct current signal is a high potential; or all switch transistor are P type transistors and the potential of the direct current signal is a low potential.

Correspondingly, there is further provided in an embodiment of the present disclosure a gate driving circuit, comprising a plurality of shift registers connected in cascades provided in the embodiment of the present disclosure;

except a first stage of shift register, a first signal output terminal of each of remaining stages of shift registers inputs a reset signal to an adjacent previous stage of shift register respectively;

except a last stage of shift register, a second signal output terminal of each of remaining stages of shift registers units inputs an input signal to an adjacent next stage of shift register.

Upon specific implementation, in the gate driving circuit provided in the embodiment of the present disclosure, in the case of all the switch transistors being N type transistors: when forward scanning is performed, the first reference signal is a high potential signal, and the second reference signal is a low potential signal; when backward scanning is performed, the first reference signal is a low potential signal, and the second reference signal is a high potential signal; or in the case of all the switch transistors being P type transistors: when forward scanning is performed, a first reference signal is a low potential signal, and a second reference signal is a high potential signal; when backward scanning is performed, the first reference signal is a high potential signal, and the second reference signal is a low potential signal.

Correspondingly, there is further provided in an embodiment of the present disclosure a display apparatus, comprising the gate driving circuit provided in the embodiment of the present disclosure.

Correspondingly, there is further provided in an embodiment of the present disclosure a driving method of any one of the shift registers as described above, comprising:

in an input phase, providing, by an input unit, a first reference signal to the first node under control of the input signal; providing, by a first output unit, a first clock signal to a first signal output terminal under control of a potential of a first node and a direct current signal to the first signal output terminal under control of a second clock signal; providing, by a second control unit, the second clock signal to a third node under control of the second clock signal; providing, by a second output unit, the second clock signal to a second signal output terminal under control of a potential of a first node and the direct current signal to the second signal output terminal under control of a potential of the third node;

in a first output phase, providing, by a first output unit, the first clock signal to the first signal output terminal under control of the potential of the first node; providing, by a first control unit, a first clock signal to a second node under control of the first clock signal and the direct current signal to the second node under control of the first signal output terminal; providing, by a second output unit, the second clock signal to the second signal output terminal under control of the potential of the first node and the direct current signal to the second signal output terminal under control of the first clock signal;

in a second output phase, providing, by a first output unit, the first control signal to the first signal output terminal under control of the potential of the first node;

providing, by a second output unit, the second clock signal to the second signal output terminal under control of the first node; providing, by the second control unit, the second clock signal to the third node under control of the second clock signal and the direct current signal to the third node under control of the second signal output terminal;

in a reset phase, providing, by a reset unit, the second reference signal to the first node under control of a reset signal; providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal;

in a maintenance phase, providing, by the first output unit, the direct current signal to the first signal output terminal under control of the second clock signal; providing, by the second control unit, the second clock signal to the third node under control of the second clock signal; providing, by the second output unit, the direct current signal to the second signal output terminal under control of the potential of the third node; or providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal.

The shift register, the driving method thereof, the gate driving circuit and the display apparatus provided in the embodiments of the present disclosure comprise: the input unit, the reset unit, the first control unit, the second control unit, the first output unit, the second output unit, the first signal output terminal and the second signal output terminal. Herein, the input unit and the reset unit are configured to control the potential of the first node, the first control unit is configured to control the potential of the second node, and the first output unit is used to control the potential of the first signal output terminal under joint control of the first node and the second node; the second control unit is configured to control the potential of the third node, and the second output unit is used to control the potential of the second signal output terminal under joint control of the first node and the third node. That is, the input unit, the reset unit, the first control unit and the first output unit are adopted to control the potential of the first signal output terminal, and the input unit, the reset unit, the second control unit and the second output unit are adopted to control the potential of the second signal output terminal, which is equivalent to utilizing the first control unit and the first output unit together with the second control unit and the second output unit to control and share the input unit and the reset unit, so as to realize functions of two shift register units. Therefore, compared with the existing two shift registers, one input unit and one reset unit are omitted, so that the present disclosure has a simpler structure, occupies smaller area, and is more suitable for a design of narrow frame.

BRIEF DESCRIPTION OF THE DRAWINGS

FIG. 4a is a schematic diagram of timing of the specific circuit of the shift register as shown in FIG. 3a;

DETAILED DESCRIPTION

Specific implementations of a shift register, a driving method thereof, a gate driving circuit and a display apparatus provided in embodiments of the present disclosure will be described below in detail by combining with accompanying drawings.

Figure 1:
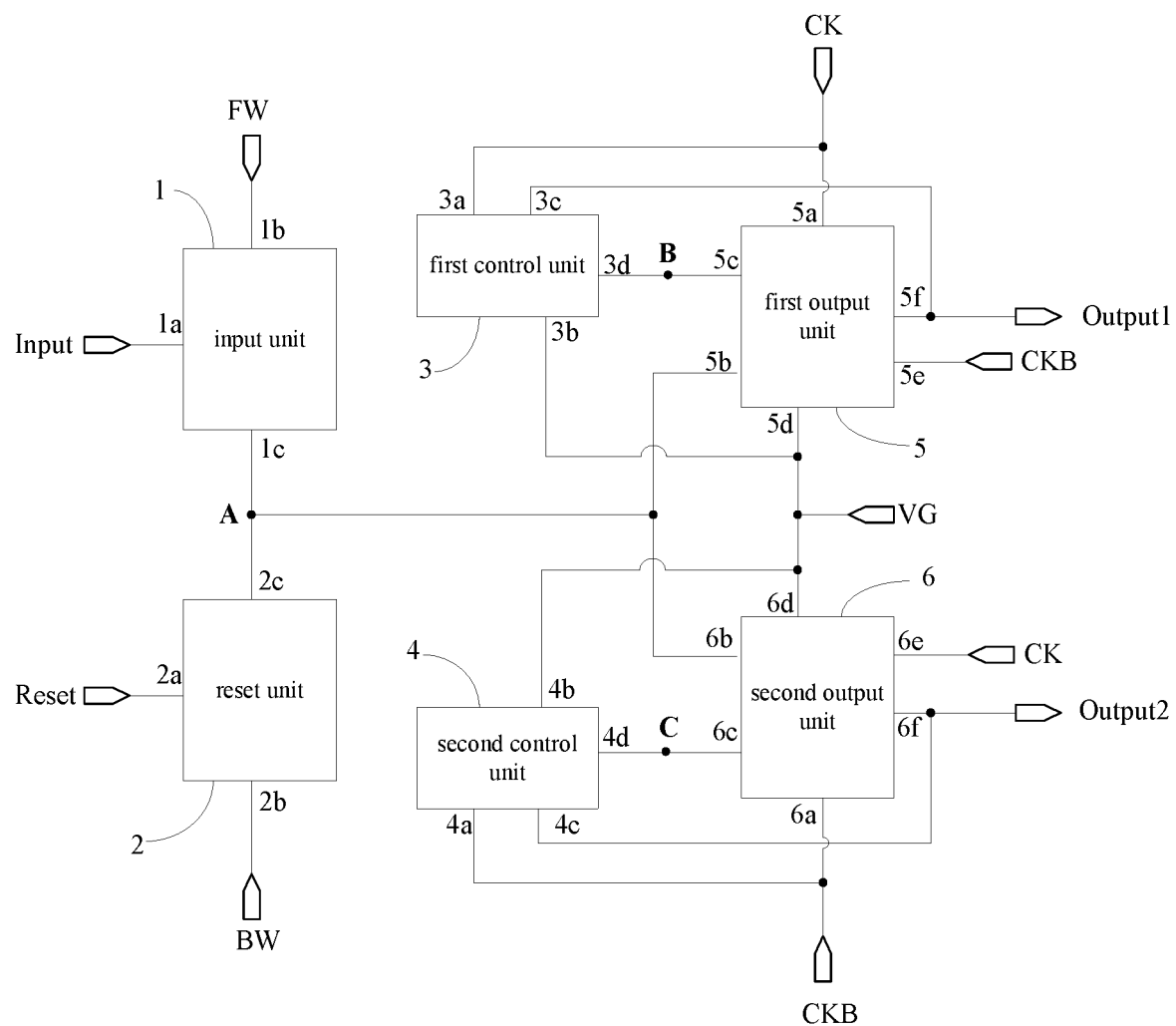
FIG. 1 is a schematic diagram of structure of a shift register provided in an embodiment of the present disclosure.

As shown in FIG. 1, there is provided in an embodiment of the present disclosure a shift register, comprising: an input unit 1, a reset unit 2, a first control unit 3, a second control unit 4, a first output unit 5, a second output unit 6, a first signal output terminal Output1 and a second signal output terminal Output2; wherein a first input terminal 1a of the input unit 1 is used to receive an input signal Input, a second input terminal 1b thereof is used to receive a first reference signal FW, and an output terminal 1c thereof is connected to a first node A; the input unit 1 is configured to provide the first reference signal FW to the first node A under control of the input signal Input;

a first input terminal 2a of the reset unit 2 is used to receive a reset signal Reset, a second input terminal 2b thereof is used to receive a second reference signal BW, and an output terminal 2c thereof is connected to the first node A; the reset unit 2 is configured to provide the second reference signal BW to the first node A under control of the reset signal Reset;

a first input terminal 3a of the first control unit is used to receive a first clock signal CK, a second input terminal 3b thereof is used to receive a direct current signal VG, a third input terminal 3c thereof is connected to the first signal output terminal Output1, and an output terminal 3d thereof is connected to a second node B; the first control unit 3 is configured to provide the first clock signal CK to the second node B under control of the first clock signal and provide the direct current signal VG to the second node B under control of the first signal output terminal;

a first input terminal 4a of the second control unit 4 is used to receive a second clock signal CKB, a second input terminal 4b thereof is used to receive the direct current signal VG, a third input terminal 4c thereof is connected to the second signal output terminal Output2, and an output terminal 4d is connected to a third node C; the second control unit 4 is configured to provide the second clock signal CKB to the third node C under control of the second clock signal CKB and provide the direct current signal to the third node C under control of the second signal output terminal Output2;

a first input terminal 5a of the first output unit 5 is used to receive the first clock signal CK, a second input terminal 5b thereof is connected to the first node A, a third input terminal 5C thereof is connected to the second node B, a fourth input terminal 5d thereof is used to receive the direct current signal VG, a fifth input terminal 5e thereof is used to receive the second clock signal terminal CKB, and an output terminal 5f thereof is connected to the first signal output terminal Output1; the first output unit 5 is configured to provide the first clock signal CK to the first signal output terminal Output1 under control of the potential of the first node A, provide the direct current signal VG to the first signal output terminal Output1 under control of the potential of the second node B, and provide the direct current signal VG to the first signal output terminal Output1 under control of the second clock signal CKB;

A first input terminal 6a of the second output unit 6 is used to receive the second clock signal CKB, a second input terminal 6b thereof is connected to the first node A, a third input terminal 6c thereof is connected to the third node C, a fourth input terminal 6d thereof is used to receive the direct current signal VG, a fifth input terminal 6e thereof is used to receive the first clock signal CK, and an output terminal 6f thereof is connected to the second signal output terminal Output2; the second output unit 6 is configured to provide the second clock signal CKB to the second signal output terminal Output2 under control of the potential of the first node A, provide the direct current signal VG to the second signal output terminal Output2 under control of the potential of the third node C, and provide the direct current signal VG to the second signal output terminal Output2 under control of the first clock signal CK;

The first clock signal CK and the second clock signal CKB are opposite in phase, and a potential of the first reference signal FW and a potential of the second reference signal BW are opposite.

The shift register provided in the embodiment of the present disclosure comprises: the input unit, the reset unit, the first control unit, the second control unit, the first output unit, the second output unit, the first signal output terminal and the second signal output terminal. Herein, the input unit and the reset unit are configured to control the potential of the first node, the first control unit is configured to control the potential of the second node, and the first output unit is used to control the potential of the first signal output terminal under joint control of the first node and the second node; the second control unit is configured to control the potential of the third node, and the second output unit is used to control the potential of the second signal output terminal under joint control of the first node and the third node. That is, the input unit, the reset unit, the first control unit and the first output unit are adopted to control the potential of the first signal output terminal, and the input unit, the reset unit, the second control unit and the second output unit are adopted to control the potential of the second signal output terminal, which is equivalent to utilizing the first control unit and the first output unit together with the second control unit and the second output unit to control and share the input unit and the reset unit, so as to realize functions of two shift register units. Therefore, compared with the existing two shift registers, one input unit and one reset unit are omitted, so that the present disclosure has a simpler structure, occupies smaller area, and is more suitable for a design of narrow frame.

It should be noted that in the shift register provided in the embodiment of the present disclosure, the reset signal is one clock signal cycle delay as compared with the input signal. By taking forward scanning as an example, when an active pulse signal of the input signal is a high potential, a potential of the first reference signal is a high potential signal, and potentials of the second reference signal and the direct current signal are low potentials; when the active pulse signal of the input signal is a low potential, the potential of the first reference signal is a low potential signal, and potentials of the second reference signal and the direct current signal are high potentials.

Operation principle of the shift register provided in the embodiment of the present disclosure will be introduced below briefly by combining with diagrams of circuit timings.

Figure 2A:
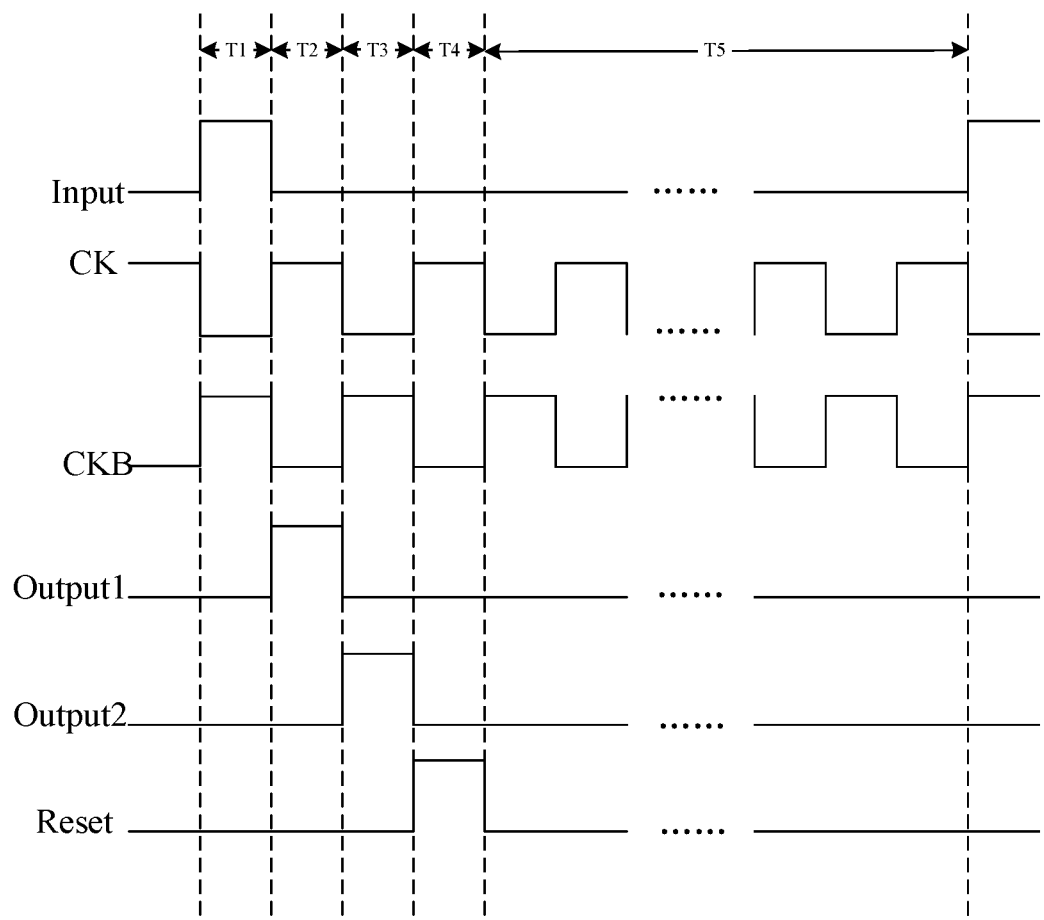
FIGS. 2a and 2b are schematic diagrams of circuit timings of a shift register provided in an embodiment of the present disclosure.
Figure 2B:
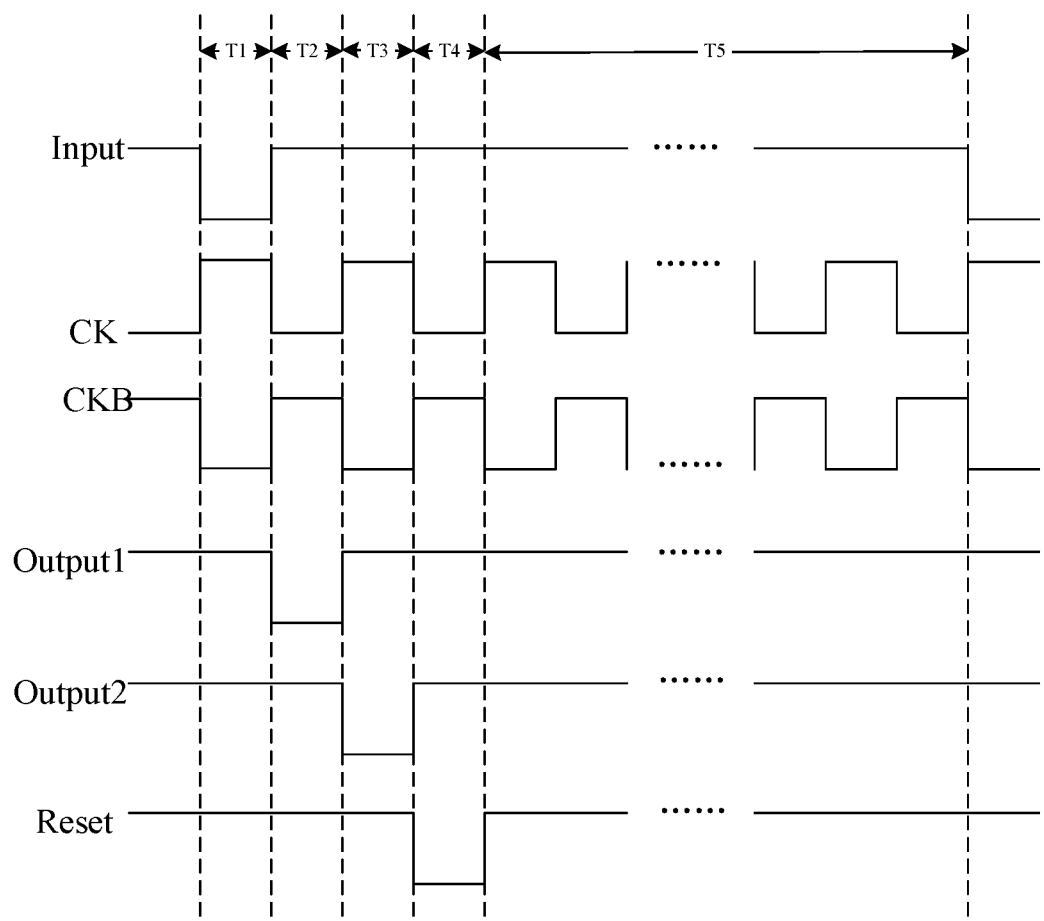

In particular, operation of the shift register provided in the embodiment of the present disclosure can have five phases, as shown in FIGS. 2a and 2b, there are an input phase T1, a first output phase T2, a second output phase T3, a reset phase T4 and a maintenance phase T5 respectively; in the following description, 1 represents a high potential, 0 represents a low potential.

First scenario: the active pulse signal of the input signal is a high potential, the potential of the first reference signal is a high potential signal, and potentials of the second reference signal and the direct current signal are low potentials. Corresponding timing diagram is as shown in FIG. 2a. Specific operation principles in respective phases are as follows:

in the input phase T1, Input=0, Reset=0, CK=0, CKB=1.

The input unit 1 provides the first reference signal FW having a high potential to the first node A under control of the input signal Input, so that the potential of the first node A is a high potential; the first output unit 5 provides the first clock signal CK having a low potential to the first signal output terminal Output1 under control of the first node A, and at the same time, the first output unit 5 further provides the direct current signal VG having a low potential to the first signal output terminal Output1 under control of the second clock signal CKB, so that the potential of the first signal output terminal Output1 is a low potential; the second control unit 4 provides the second clock signal CKB to the third node C under control of the second clock signal CKB, so that the potential of the third node C is a high potential; the second output unit 6 provides the second clock signal CKB having a high potential to the second signal output terminal Output2 under control of the first node A, and at the same time, provides the direct current signal VG having a low potential to the second signal output terminal Output2 under control of the third node C, so that the potential of the second signal output terminal Outpout2 is a low potential.

In the first output phase T2, Input=0, Reset=0, CK=1, CKB=0.

The potential of the first node A maintains a high potential, and the first output unit 5 provides the first clock signal CK having a high potential to the first signal output terminal Output1 under control of the first node A, so that the potential of the first signal output terminal Output 1 is a high potential; the first control unit 3 provides the first clock signal CK to the second node B under control of the first clock signal CK, and at the same time, provides the direct current signal VG having a low potential to the second node B under control of the first signal output terminal Output1, so that the potential of the second node B is a low potential; the second output unit 6 provides the second clock signal CKB having a low potential to the second signal output terminal Output2 under control of the first node A, and at the same time, provides the direct current signal VG having a low potential to the second signal output terminal Output2 under control of the first clock signal CK, so that the potential of the second signal output terminal Output2 is a low potential.

In the second output phase T3, Input=0, Reset=0, CK=0, CKB=1.

The potential of the first node A still maintains a high potential, and the first output unit 5 provides the first clock signal CK having a low potential to the first signal output terminal Output1 under control of the first node A, so that the potential of the first signal output terminal Output1 is a low potential; the second output unit 6 provides the second clock signal CKB having a high potential to the second signal output terminal Output2 under control of the first node A, so that the potential of the second signal output terminal Output2 is a high potential; the second control unit 4 provides the second clock signal CKB having a high potential to the third node C under control of the second clock signal CKB, and at the same time, provides the direct current VG having a low potential to the third node C under control of the second signal output terminal Output2, so that the potential of the third node C is a low potential.

In the reset phase T4, Input=0, Reset=1, CK=1, CKB=0.

The reset unit 2 provides the second reference signal BW having a low potential to the first node A under control of the reset signal Reset, so that the potential of the first node A is a low potential; the first control unit 3 provides the first clock signal CK to the second node B under control of the first clock signal CK, so that the potential of the second node B is a high potential; the first output unit 5 provides the direct current signal VG having a low potential to the first signal output terminal Output1 under control of the second node B, so that the potential of the first signal output terminal Output1 is a low potential; the second output unit 6 provides the direct current signal VG having a low potential to the second signal output terminal Output2 under control of the first clock signal CK, so that the potential of the second signal output terminal Output2 is a low potential.

In the maintenance phase T5, Input=0, Reset=0, CK=0 or 1, CKB=1 or 0.

The potential of the first node A maintains a low potential, in the case of CK=0, CKB=1: the first output unit 5 provides the direct current VG having a low potential to the first signal output terminal Output1 under control of the second clock signal CKB, so that the potential of the first signal output terminal Output1 is a low potential; the second control unit 4 provides the second clock signal CKB to the third node C under control of the second clock signal CKB, so that the potential of the third node C is a high potential, and the second output unit 6 provides the direct current signal VG having a low potential to the second signal output terminal Output2 under control of the third node C, so that the potential of the second signal output terminal Output2 is a low potential; in the case of CK=1, CKB=0: the first control unit 3 provides the first clock signal CK to the second node B under control of the first clock signal CK, so that the potential of the second node B is a high potential, and the first output unit 5 provides the direct current signal VG having a low potential to the first signal output terminal Output1 under control of the second node B, so that the potential of the first signal output terminal Output1 is a low potential; the second output unit 6 provides the direct current signal VG having a low potential to the second signal output terminal Output2 under control of the first clock signal CK, so that the potential of the second signal output terminal Output2 is a low potential.

It can be known from the above description that after receiving the input signal, the shift register unit provided in the embodiment of the present disclosure output scanning signals via the first signal output terminal and the second signal output terminal sequentially, so as to realize functions of two shift registers.

Second scenario: the active pulse signal of the input signal is a low potential, the potential of the first reference signal is a low potential signal, and potentials of the second reference signal and the direct current signal are high potentials. Corresponding timing diagram is as shown in FIG. 2b. Specific operation principles in respective phases are as follows:

in the input phase T1, Input=0, Reset=1, CK=1, CKB=0.

The input unit 1 provides the first reference signal FW having a low potential to the first node A under control of the input signal Input, so that the potential of the first node A is a low potential; the first output unit 5 provides the first clock signal CK having a high potential to the first signal output terminal Output1 under control of the first node A, and at the same time, the first output unit 5 further provides the direct current signal VG having a high potential to the first signal output terminal Output1 under control of the second clock signal CKB, so that the potential of the first signal output terminal Output1 is a high potential; the second control unit 4 provides the second clock signal CKB to the third node C under control of the second clock signal CKB, so that the potential of the third node C is a low potential; the second output unit 6 provides the second clock signal CKB having a low potential to the second signal output terminal Output2 under control of the first node A, and at the same time, provides the direct current signal VG having a high potential to the second signal output terminal Output2 under control of the third node C, so that the potential of the second signal output terminal Outpout2 is a high potential.

In the first output phase T2, Input=1, Reset=1, CK=0, CKB=1.

The potential of the first node A maintains a low potential, and the first output unit 5 provides the first clock signal CK having a low potential to the first signal output terminal Output1 under control of the first node A, so that the potential of the first signal output terminal Output1 is a low potential; the first control unit 3 provides the first clock signal CK to the second node B under control of the first clock signal CK, and at the same time, provides the direct current signal VG having a high potential to the second node B under control of the first signal output terminal Output1, so that the potential of the second node B is a high potential; the second output unit 6 provides the second clock signal CKB having a high potential to the second signal output terminal Output2 under control of the first node A, and at the same time, provides the direct current signal VG having a high potential to the second signal output terminal Output2 under control of the first clock signal CK, so that the potential of the second signal output terminal Output2 is a high potential.

In the second output phase T3, Input=1, Reset=1, CK=1, CKB=0.

The potential of the first node A still maintains a low potential, and the first output unit 5 provides the first clock signal CK having a high potential to the first signal output terminal Output1 under control of the first node A, so that the potential of the first signal output terminal Output1 is a high potential; the second output unit 6 provides the second clock signal CKB having a low potential to the second signal output terminal Output2 under control of the first node A, so that the potential of the second signal output terminal Output2 is a low potential; the second control unit 4 provides the second clock signal CKB to the third node C under control of the second clock signal CKB, and at the same time, provides the direct current VG having a high potential to the third node C under control of the second signal output terminal Output2, so that the potential of the third node C is a high potential.

In the reset phase T4, Input=1, Reset=0, CK=0, CKB=1.

The reset unit 2 provides the second reference signal BW having a high potential to the first node A under control of the reset signal Reset, so that the potential of the first node A is a high potential; the first control unit 3 provides the first clock signal CK to the second node B under control of the first clock signal CK, so that the potential of the second node B is a low potential; the first output unit 5 provides the direct current signal VG having a high potential to the first signal output terminal Output1 under control of the second node B, so that the potential of the first signal output terminal Output1 is a high potential; the second output unit 6 provides the direct current signal VG having a high potential to the second signal output terminal Output2 under control of the first clock signal CK, so that the potential of the second signal output terminal Output2 is a high potential.

In the maintenance phase T5, Input=1, Reset=1, CK=1 or 0, CKB=0 or 1.

The potential of the first node A maintains a high potential, in the case of CK=1, CKB=0: the first output unit 5 provides the direct current VG having a high potential to the first signal output terminal Output1 under control of the second clock signal CKB, so that the potential of the first signal output terminal Output1 is a high potential; the second control unit 4 provides the second clock signal CKB to the third node C under control of the second clock signal CKB, so that the potential of the third node C is a low potential, and the second output unit 6 provides the direct current signal VG having a high potential to the second signal output terminal Output2 under control of the third node C, so that the potential of the second signal output terminal Output2 is a high potential; in the case of CK=0, CKB=1: the first control unit 3 provides the first clock signal CK to the second node B under control of the first clock signal CK, so that the potential of the second node B is a low potential, and the first output unit 5 provides the direct current signal VG having a high potential to the first signal output terminal Output1 under control of the second node B, so that the potential of the first signal output terminal Output1 is a high potential; the second output unit 6 provides the direct current signal VG having a high potential to the second signal output terminal Output2 under control of the first clock signal CK, so that the potential of the second signal output terminal Output2 is a high potential.

It can be known from the above description that after receiving the input signal, the shift register unit provided in the embodiment of the present disclosure outputs scanning signals via the first signal output terminal and the second signal output terminal sequentially, so as to realize functions of two shift registers.

The present disclosure will be described below in detail by combining with specific embodiments. It should be noted that the present embodiment is used to explain the present disclosure to the better, but not to limit the present disclosure.

Figure 3A:
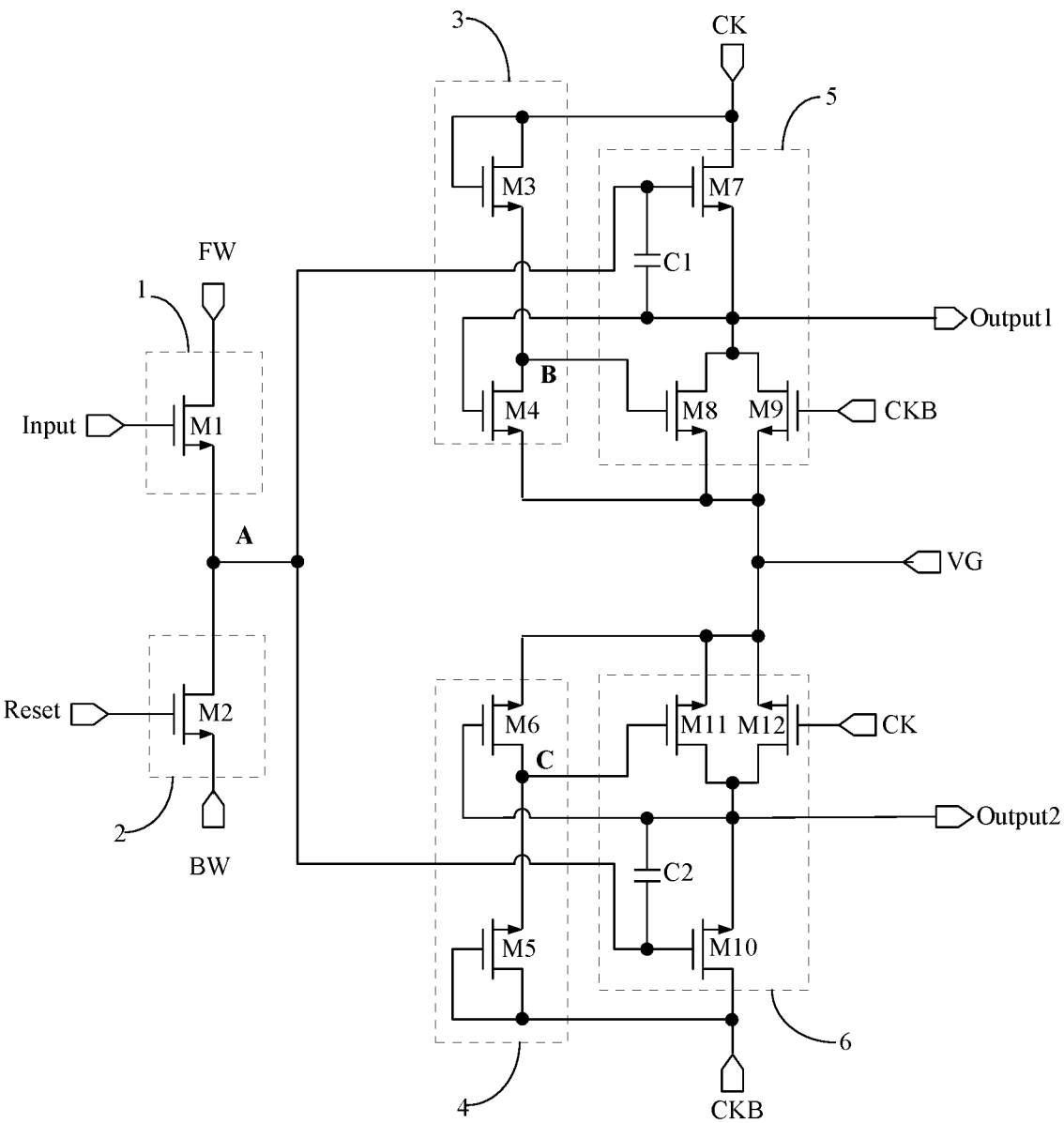
FIGS. 3a and 3b are schematic diagrams of specific structures of a shift register provided in an embodiment of the present disclosure.
Figure 3B:
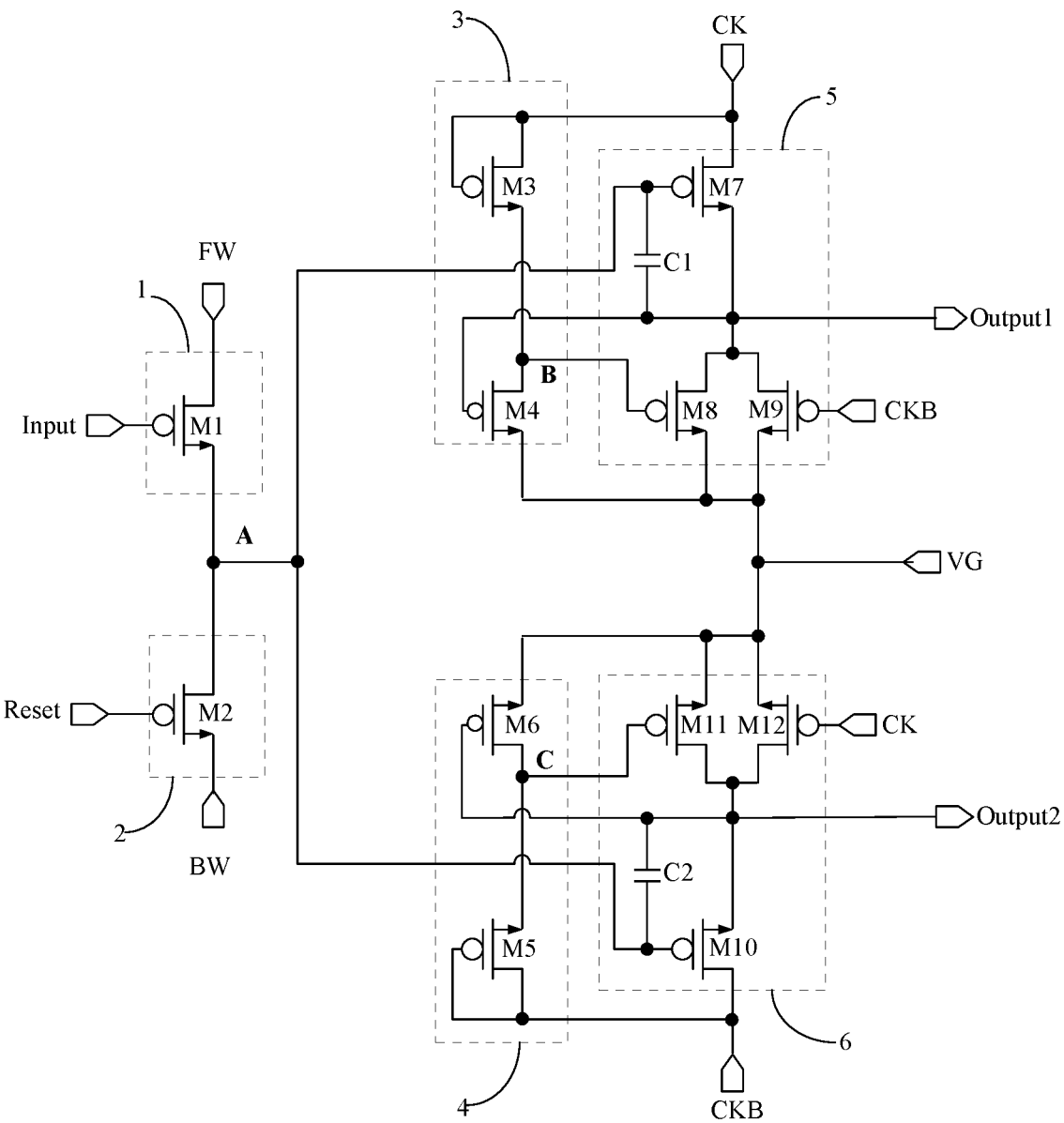

Alternatively, in specific implementation, in the shift register provided in the embodiment of the present disclosure, as shown in FIGS. 3a and 3b, the input unit 1 can specifically comprise: a first switch transistor M1; wherein, a gate of the first switch transistor M1 is used to receive the input signal Input, a source thereof is used to receive the first reference signal FW, and a drain thereof is connected to the first node A.

In specific implementation, as shown in FIG. 3a, the first switch transistor M1 can be an N type transistor, or as shown in FIG. 3b, the first switch transistor M1 can also be a P type transistor, to which no limitation is made herein.

The above description just takes an example to describe the specific structure of the input unit in the shift register. In specific implementation, the specific structure of the input unit is not limited to the above structure provided in the embodiment of the present disclosure, and can also be other structures known by those skilled in the art, to which no limitation is made herein.

Alternatively, in specific implementation, in the shift register provided in the embodiment of the present disclosure, as shown in FIGS. 3a and 3b, the reset unit 2 can specifically comprise: a second switch transistor M2; wherein, a gate of the second switch transistor M2 is used to receive the reset signal Reset, a source hereof is used to receive the second reference signal BW, and a drain thereof is connected to the first node A.

In specific implementation, as shown in FIG. 3a, the second switch transistor M2 can be an N type transistor, or as shown in FIG. 3b, the second switch transistor M2 can also be a P type transistor, to which no limitation is made herein.

The above description just takes an example to describe the specific structure of the reset unit in the shift register. In specific implementation, the specific structure of the reset unit is not limited to the above structure provided in the embodiment of the present disclosure, and can also be other structures known by those skilled in the art, to which no limitation is made herein.

Alternatively, in specific implementation, in the shift register provided in the embodiment of the present disclosure, as shown in FIGS. 3a and 3b, the first control unit 3 can specifically comprise: a third switch transistor M3 and a fourth switch transistor M4; wherein, both a gate and a source of the third switch transistor M3 are used to receive the first clock signal CK, and a drain thereof is connected to the second node B; and a gate of the fourth switch transistor M4 is connected to the first signal output terminal Output1, a source thereof is used to receive a direct current signal VG, and a drain thereof is connected to the second node B.

In specific implementation, as shown in FIG. 3a, the third switch transistor M3 and the fourth switch transistor M4 can be N type transistors, or as shown in FIG. 3b, the third switch transistor M3 and the fourth switch transistor M4 can also be P type transistors, to which no limitation is made herein.

The above description just takes an example to describe the specific structure of the first control unit in the shift register. In specific implementation, the specific structure of the first control unit is not limited to the above structure provided in the embodiment of the present disclosure, and can also be other structures known by those skilled in the art, to which no limitation is made herein.

Alternatively, in specific implementation, in the shift register provided in the embodiment of the present disclosure, as shown in FIGS. 3a and 3b, the second control unit 4 can specifically comprise: a fifth switch transistor M5 and a sixth switch transistor M6; wherein, both a gate and a source of the fifth switch transistor M5 are used to receive the second clock signal CKB, and a drain thereof is connected to the third node C; and a gate of the sixth switch transistor M6 is connected to the second signal output terminal Output2, a source thereof is used to receive the direct current signal VG, and a drain thereof is connected to the third node C.

In specific implementation, as shown in FIG. 3a, the fifth switch transistor M5 and the sixth switch transistor M6 can be N type transistors, or as shown in FIG. 3b, the fifth switch transistor M5 and the sixth switch transistor M6 can also be P type transistors, to which no limitation is made herein.

The above description just takes an example to describe the specific structure of the second control unit in the shift register. In specific implementation, the specific structure of the second control unit is not limited to the above structure provided in the embodiment of the present disclosure, and can also be other structures known by those skilled in the art, to which no limitation is made herein.

Alternatively, in specific implementation, in the shift register provided in the embodiment of the present disclosure, as shown in FIGS. 3a and 3b, the first output unit 5 can specifically comprise: a seventh switch transistor M7, an eighth switch transistor M8, a ninth switch transistor M9, and a first capacitor C1; wherein, a gate of the seventh switch transistor M7 is connected to the first node A, a source thereof is connected to receive the first clock signal CK, and a drain thereof is connected to the first signal output terminal Output1;

a gate of the eighth switch transistor is connected to the second node B, a source thereof is used to receive the direct current signal VG, and a drain thereof is connected to the first signal output terminal Output1;

a gate of the ninth switch transistor is used to receive the second clock signal CKB, a source thereof is used to receive the direct current signal VG, and a drain thereof is connected to the first signal output terminal Output1; and the first capacitor C1 is connected between the first node A and the first signal output terminal Output1.

In specific implementation, as shown in FIG. 3a, the seventh switch transistor M7, the eighth switch transistor M8 and the ninth switch transistor M9 can be N type transistors, or as shown in FIG. 3b, the seventh switch transistor M7, the eighth switch transistor M8 and the ninth switch transistor M9 can also be P type transistors, to which no limitation is made herein.

The above description just takes an example to describe the specific structure of the first output unit in the shift register. In specific implementation, the specific structure of the first output unit is not limited to the above structure provided in the embodiment of the present disclosure, and can also be other structures known by those skilled in the art, to which no limitation is made herein.

Alternatively, in specific implementation, in the shift register provided in the embodiment of the present disclosure, as shown in FIGS. 3a and 3b, the second output unit 6 can specifically comprise: a tenth switch transistor M10, an eleventh switch transistor M11, a twelfth switch transistor M12, and a second capacitor C2; wherein, a gate of the tenth switch transistor M10 is connected to the first node A, a source thereof is used to receive the second clock signal CKB, and a drain thereof is connected to the second signal output terminal Output2;

a gate of the eleventh switch transistor M11 is connected to the third node C, a source thereof is used to receive the direct current signal VG, and a drain thereof is connected to the second signal output terminal Output2;

a gate of the twelfth switch transistor M12 is used to receive the first clock signal CK, a source thereof is used to receive the direct current signal VG, and a drain thereof is connected to the second signal output terminal Output2; and the second capacitor C2 is connected between the first node A and the second signal output terminal Output2.

In specific implementation, as shown in FIG. 3a, the tenth switch transistor M10, the eleventh switch transistor M11, and the twelfth switch transistor M12 can be N type transistors, or as shown in FIG. 3b, the tenth switch transistor M10, the eleventh switch transistor M11, and the twelfth switch transistor M12 can also be P type transistors, to which no limitation is made herein.

The above description just takes an example to describe the specific structure of the second output unit in the shift register. In specific implementation, the specific structure of the second output unit is not limited to the above structure provided in the embodiment of the present disclosure, and can also be other structures known by those skilled in the art, to which no limitation is made herein.

Alternatively, in the shift register provided in the embodiment of the present disclosure, transistors are generally transistors adopting a same material. In specific implementation, all the transistors adopt P type transistors or N type transistors. In specific implementation, when all the switch transistors are N type transistors, the potential of the direct current signal is a high potential; when all the switch transistors are P type transistors, the potential of the direct current signal is a low potential.

It should be noted that respective N type transistors are in a turn-on state when potentials of their gates are high potentials, while being in a turn-off state when potentials of their gates are low potentials. Respective P type transistors are in a turn-on state when potentials of their gates are low potentials, while being in a turn-off state when potentials of their gates are high potentials.

Further, the switch transistors mentioned in the embodiment of the present disclosure can be thin film transistors (TFT) or can be metal oxide semiconductor field effect transistors (MOS), to which no limitation is made herein. In specific implementation, functions of sources and drains of these transistors can be exchanged depending on different types of transistors as well as different input signals. No specific distinction is made herein.

Figure 4A:
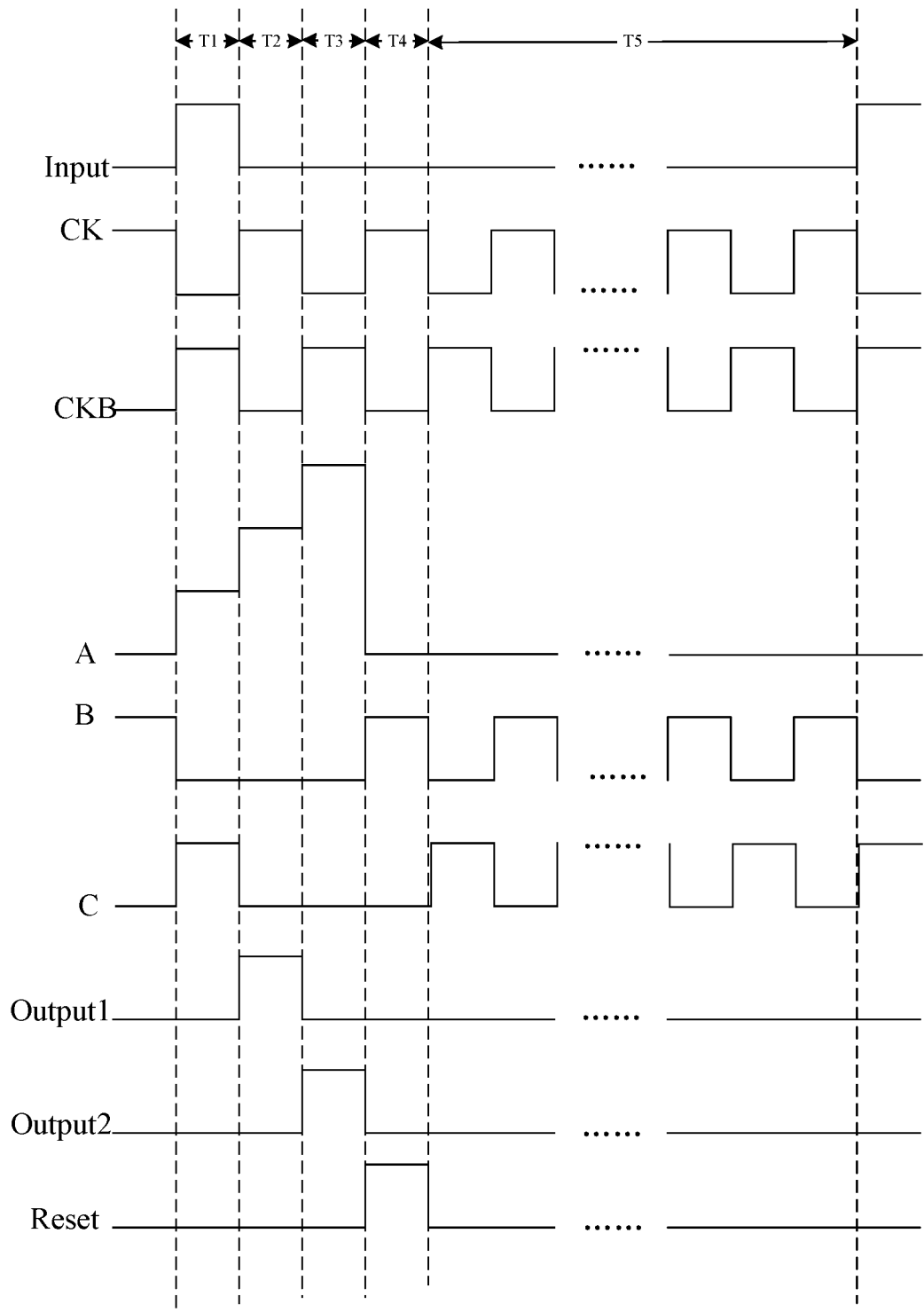
Figure 4B:
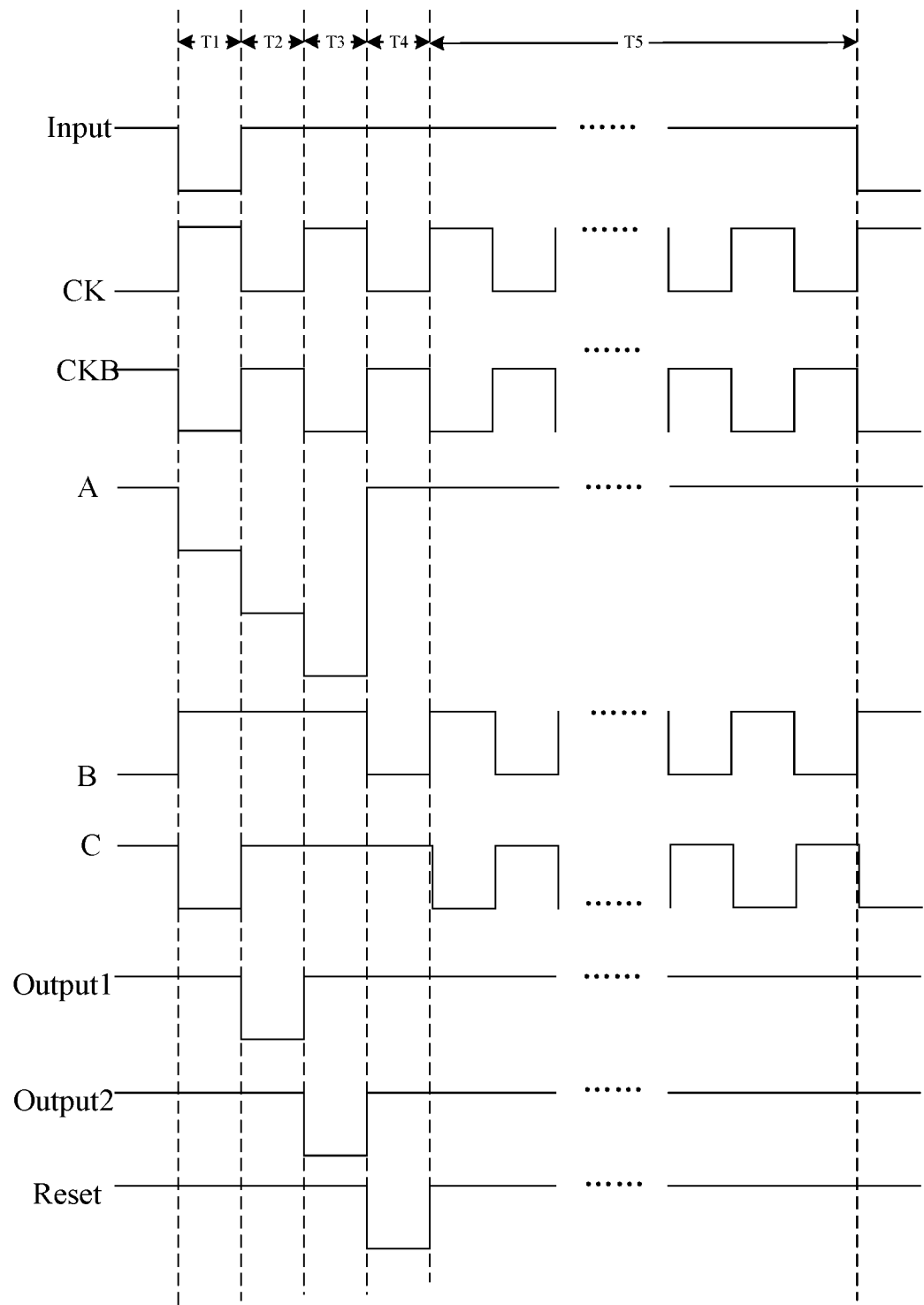
FIG. 4b is a schematic diagram of timing of the specific circuit of the shift register as shown in FIG. 3b.

Operation processes of the shift registers in the embodiments of the present disclosure will be described below by combing with the shift registers as shown in FIGS. 3a and 3b. Their operation timing diagrams are as shown in FIGS. 4a and 4b, and can be divided into five phases, i.e., T1, T2, T3, T4, and T5.

By taking the shift register in FIG. 3a as an example, all the switch transistors are N type transistors, the active pulse signal of the input signal is a high potential signal, the potential of the first reference signal is a high potential, and potentials of the second reference signal and the direct current signal are low potentials. The corresponding operation timing diagram is as shown in FIG. 4a.

In the input phase T1, Input=1, Reset=0. CK=0, CKB=1.

Since Input=1, the first switch transistor M1 is turned on, the turned-on first switch transistor M1 provides the first reference signal FW having a high potential to the first node A, so that the potential of the first node A is a high potential; the first capacitor C1 and the second capacitor C2 starts to be charged; since the potential of the first node A is a high potential, the seventh switch transistor M7 is turned on, and the turned-on seventh switch transistor M7 provides the first clock signal CK having a low potential to the first signal output terminal Output1. At the same time, since CKB=1, the ninth switch transistor M9 is turned on, and the turned-on ninth switch transistor M9 provides the direct current signal VG having a low potential to the first signal output terminal Output1, so that the potential of the first signal output terminal Output1 is a low potential; since CKB=1, the fifth switch transistor M5 is turned on, and the turned-on fifth switch transistor M5 provides the second clock signal CKB having a high potential to the third node C, so that the potential of the third node C is a high potential; since the potential of the first node A is a high potential, the tenth switch transistor M10 is turned on, and the turned-on tented switch transistor M10 provides the second clock signal CKB having a high potential to the second signal output terminal Output2. At the same time, since the potential of the third node C is a high potential, the eleventh switch transistor M11 is in a turn-on state, and the turned-on eleventh switch transistor M11 provides the direct current signal VG having a low potential to the second signal output terminal Output2, so that the potential of the second signal output terminal Output2 is a low potential.

In the first output phase T2, Input=0, Reset=0, CK=1, CKB=0.

In this phase, no signal is input to the node A, and the first node is in a floating state. Due to bootstrap effect of the first capacitor C1, the potential of the first node A is further pulled up; the seventh transistor M7 is turned on, the turned-on seventh switch transistor M7 provides the first clock signal CK having a high potential to the first signal output terminal Output1, so that the potential of the first signal output terminal Output1 is a high potential; since the potential of the first signal output terminal Output1 is a high potential, the fourth switch transistor M4 is in a turn-on state, the turned-on fourth switch transistor M4 provides the direct current signal VG having a low potential to the second node B. At the same time, since CK=1, the third switch transistor M3 is turned on, the turned-on third switch transistor M3 provides the first clock signal CK having a high potential to the second node B, so that the potential of the second node B is a low potential; since the potential of the first node A is further pulled up, the tenth switch transistor M10 is turned on, and the turned-on tenth switch transistor M10 provides the second clock signal CKB having a low potential to the second signal output terminal Output2. At the same time, since CK=1, the twelfth switch transistor M12 is turned on, the turned-on twelfth switch transistor M12 provides the direct current signal VG having a low potential to the second signal output terminal Output2, so that the potential of the second signal output terminal is a low potential.

In the second output phase T3, Input=0, Reset=0, CK=0, CKB=1.

In this phase, no signal is input to the first node A, and the first node is in a floating state. Due to bootstrap effect of the second capacitor C2, the potential of the first node A is further pulled up; the seventh switch transistor M7 is turned on, the turned-on seventh switch transistor M7 provides the first clock signal CK having a low potential to the first signal output terminal Output1. At the same time, since CKB=1, the ninth switch transistor M9 is turned on, the turned-on ninth switch transistor M9 provides the direct current signal VG having a low potential to the first signal output terminal Output1, so that the potential of the first signal output terminal Output1 is a low potential; since the potential of the first node A is further pulled up, the tenth switch transistor M10 is turned on, and the turned-on tenth switch transistor M10 provides the second clock signal CKB having a high potential to the second signal output terminal Output2 $p$, so that the potential of the second signal output terminal Output2 is a high potential; since the potential of the second signal output terminal output2 is a high potential, the sixth switch transistor M6 is in a turn-on state, and the turned-on sixth switch transistor M6 provides the direct current signal VG having a low potential to the third node C. At the same time, since CKB=1, the fifth switch transistor M5 is turned on, the turned-on fifth switch transistor M5 provides the second clock signal CKB having a high potential to the third node C, so that the potential of the third node C is a low potential.

In the reset phase T4, Input=0, Reset=1, CK=1, CKB=0.

Since Reset=1, the second switch transistor M2 is turned on, the turned-on second switch transistor M2 provides the second reference signal BW having a low potential to the first node A, so that the potential of the first node A is a low potential; since CK=1, the third switch transistor M3 is turned on, the turned-on third switch transistor M3 provides the first clock signal CK to the second node B, so that the potential of the second node B is a high potential; since the potential of the second node B is a high potential, the eighth switch transistor M8 is turned on, and the turned-on eighth switch transistor M8 provides the direct current VG having a low potential to the first signal output terminal Output1, so that the potential of the first signal output terminal Output1 is a low potential; since CK=1, the twelfth switch transistor M12 is turned on, the turned-on twelfth switch transistor M12 provides the direct current signal VG having a low potential to the second signal output terminal Output2, so that the potential of the second signal output terminal Output2 is a low potential.

In the maintenance phase T5, Input=0, Reset=0, CK=0 or 1, CKB=1 or 0.

The potential of the first node A maintains a low potential, in the case of CK=0, CKB=1: since CKB=1, the ninth switch transistor M9 is turned on, the turned-on ninth switch transistor M9 provides the direct current signal VG having a low potential to the first signal output terminal Output1, so that the potential of the first signal output terminal Output1 is a low potential; since CKB=1, the fifth switch transistor M5 is turned on, the turned-on fifth switch transistor M5 provides the second clock signal CKB to the third node C, so that the potential of the third node C is a high potential; since the potential of the third node C is a high potential, the eleventh switch transistor M11 is turned on, the turned-on eleventh switch transistor M11 provides the direct current signal VG having a low potential to the second signal output terminal Output2, so that the potential of the second signal output terminal Output2 is a low potential;

In the case of CK=1, CKB=0: since CK=1, the third switch transistor M3 is turned on, the turned-on third switch transistor M3 provides the first clock signal CK to the second node B, so that the potential of the second node B is a high potential; since the potential of the second node B is a high potential, the eighth switch transistor M8 is turned on, the turned-on eighth transistor M8 provides the direct current signal VG having a low potential to the first signal output terminal Output1, so that the potential of the first signal output terminal Output1 is a low potential; since CK=1, the twelfth switch transistor M12 is turned on, the turned-on twelfth switch transistor M12 provides the direct current signal VG having a low potential to the second signal output terminal Output2, so that the potential of the second signal output terminal is a low potential.

It can be known from the above description that after receiving the input signal, the shift register provided in the embodiment of the present disclosure outputs scanning signals via the first signal output terminal and the second signal output terminal through coordination of twelfth switch transistors sequentially, so as to realize functions of two shift registers. Therefore, compared with the existing two shift registers, the shift register provided in the embodiment of the present disclosure has advantages of fewer number of switch transistors, simple structure and small occupation area, and is more beneficial for the design of narrow frame.

By taking the shift register in FIG. 3b as an example, all the switch transistors are P type transistors, the active pulse signal of the input signal is a low potential signal, the potential of the first reference signal is a low potential, and potentials of the second reference signal and the direct current signal are high potentials. The corresponding operation timing diagram is as shown in FIG. 4b.

In the input phase T1, Input=0, Reset=1. CK=1, CKB=0.

Since Input=0, the first switch transistor M1 is turned on, the turned-on first switch transistor M1 provides the first reference signal FW having a low potential to the first node A, so that the potential of the first node A is a low potential; the first capacitor C1 and the second capacitor C2 starts to be charged; since the potential of the first node A is a low potential, the seventh switch transistor M7 is turned on, and the turned-on seventh switch transistor M7 provides the first clock signal CK having a high potential to the first signal output terminal Output1. At the same time, since CKB=0, the ninth switch transistor M9 is turned on, and the turned-on ninth switch transistor M9 provides the direct current signal VG having a high potential to the first signal output terminal Output1, so that the potential of the first signal output terminal Output1 is a high potential; since CKB=1, the fifth switch transistor M5 is turned on, and the turned-on fifth switch transistor M5 provides the second clock signal CKB having a low potential to the third node C, so that the potential of the third node C is a low potential; since the potential of the first node A is a low potential, the tenth switch transistor M10 is turned on, and the turned-on tented switch transistor M10 provides the second clock signal CKB having a low potential to the second signal output terminal Output2. At the same time, since the potential of the third node C is a low potential, the eleventh switch transistor M11 is in a turn-on state, and the turned-on eleventh switch transistor M11 provides the direct current signal VG having a high potential to the second signal output terminal Output2, so that the potential of the second signal output terminal Output2 is a high potential.

In the first output phase T2, Input=1, Reset=1, CK=0, CKB=1.

In this phase, no signal is input to the node A, and the first node is in a floating state. Due to bootstrap effect of the first capacitor C1, the potential of the first node A is further pulled down; the seventh transistor M7 is turned on, the turned-on seventh switch transistor M7 provides the first clock signal CK having a low potential to the first signal output terminal Output1, so that the potential of the first signal output terminal Output1 is a low potential; since the potential of the first signal output terminal Output1 is a low potential, the fourth switch transistor M4 is in a turn-on state, the turned-on fourth switch transistor M4 provides the direct current signal VG having a high potential to the second node B. At the same time, since CK=0, the third switch transistor M3 is turned on, the turned-on third switch transistor M3 provides the first clock signal CK having a low potential to the second node B, so that the potential of the second node B is a high potential; since the potential of the first node A is further pulled up, the tenth switch transistor M10 is turned on, and the turned-on tenth switch transistor M10 provides the second clock signal CKB having a high potential to the second signal output terminal Output2. At the same time, since CK=0, the twelfth switch transistor M12 is turned on, the turned-on twelfth switch transistor M12 provides the direct current signal VG having a high potential to the second signal output terminal Output2, so that the potential of the second signal output terminal is a high potential.

In the second output phase T3, Input=1, Reset=1, CK=1, CKB=0.

In this phase, no signal is input to the first node A, and the first node is in a floating state. Due to bootstrap effect of the second capacitor C2, the potential of the first node A is further pulled down; the seventh switch transistor M7 is turned on, the turned-on seventh switch transistor M7 provides the first clock signal CK having a high potential to the first signal output terminal Output1. At the same time, since CKB=0, the ninth switch transistor M9 is turned on, the turned-on ninth switch transistor M9 provides the direct current signal VG having a high potential to the first signal output terminal Output1, so that the potential of the first signal output terminal Output1 is a high potential; since the potential of the first node A is further pulled up, the tenth switch transistor M10 is turned on, and the turned-on tenth switch transistor M10 provides the second clock signal CKB having a low potential to the second signal output terminal Output2, so that the potential of the second signal output terminal Output2 is a low potential; since the potential of the second signal output terminal output2 is a low potential, the sixth switch transistor M6 is in a turn-on state, and the turned-on sixth switch transistor M6 provides the direct current signal VG having a high potential to the third node C. At the same time, since CKB=0, the fifth switch transistor M5 is turned on, the turned-on fifth switch transistor M5 provides the second clock signal CKB having a low potential to the third node C, so that the potential of the third node C is a high potential.

In the reset phase T4, Input=1, Reset=0, CK=0, CKB=1.

Since Reset=0, the second switch transistor M2 is turned on, the turned-on second switch transistor M2 provides the second reference signal BW having a high potential to the first node A, so that the potential of the first node A is a high potential; since CK=0, the third switch transistor M3 is turned on, the turned-on third switch transistor M3 provides the first clock signal CK to the second node B, so that the potential of the second node B is a low potential; since the potential of the second node B is a low potential, the eighth switch transistor M8 is turned on, and the turned-on eighth switch transistor M8 provides the direct current VG having a high potential to the first signal output terminal Output1, so that the potential of the first signal output terminal Output1 is a high potential; since CK=0, the twelfth switch transistor M12 is turned on, the turned-on twelfth switch transistor M12 provides the direct current signal VG having a high potential to the second signal output terminal Output2, so that the potential of the second signal output terminal Output2 is a high potential.

In the maintenance phase T5, Input=1, Reset=1, CK=1 or 0, CKB=0 or 1.

The potential of the first node A maintains a high potential, in the case of CK=1, CKB=0: since CKB=0, the ninth switch transistor M9 is turned on, the turned-on ninth switch transistor M9 provides the direct current signal VG having a high potential to the first signal output terminal Output1, so that the potential of the first signal output terminal Output1 is a high potential; since CKB=0, the fifth switch transistor M5 is turned on, the turned-on fifth switch transistor M5 provides the second clock signal CKB to the third node C, so that the potential of the third node C is a low potential; since the potential of the third node C is a low potential, the eleventh switch transistor M11 is turned on, the turned-on eleventh switch transistor M11 provides the direct current signal VG having a high potential to the second signal output terminal Output2, so that the potential of the second signal output terminal Output2 is a high potential;

In the case of CK=0, CKB=1: since CK=0, the third switch transistor M3 is turned on, the turned-on third switch transistor M3 provides the first clock signal CK to the second node B, so that the potential of the second node B is a low potential; since the potential of the second node B is a low potential, the eighth switch transistor M8 is turned on, the turned-on eighth transistor M8 provides the direct current signal VG having a high potential to the first signal output terminal Output1, so that the potential of the first signal output terminal Output1 is a high potential; since CK=0, the twelfth switch transistor M12 is turned on, the turned-on twelfth switch transistor M12 provides the direct current signal VG having a high potential to the second signal output terminal Output2, so that the potential of the second signal output terminal Output2 is a high potential.

It can be known from the above description that after being input the input signal, the shift register provided in the embodiment of the present disclosure outputs scanning signals via the first signal output terminal and the second signal output terminal through coordination of twelve switch transistors sequentially, so as to realize functions of two shift registers. Therefore, compared with the existing two shift registers, the shift register provided in the embodiment of the present disclosure has advantages of fewer number of switch transistors, simple structure and small occupation area, and is more beneficial for the design of narrow frame.

Figure 5:
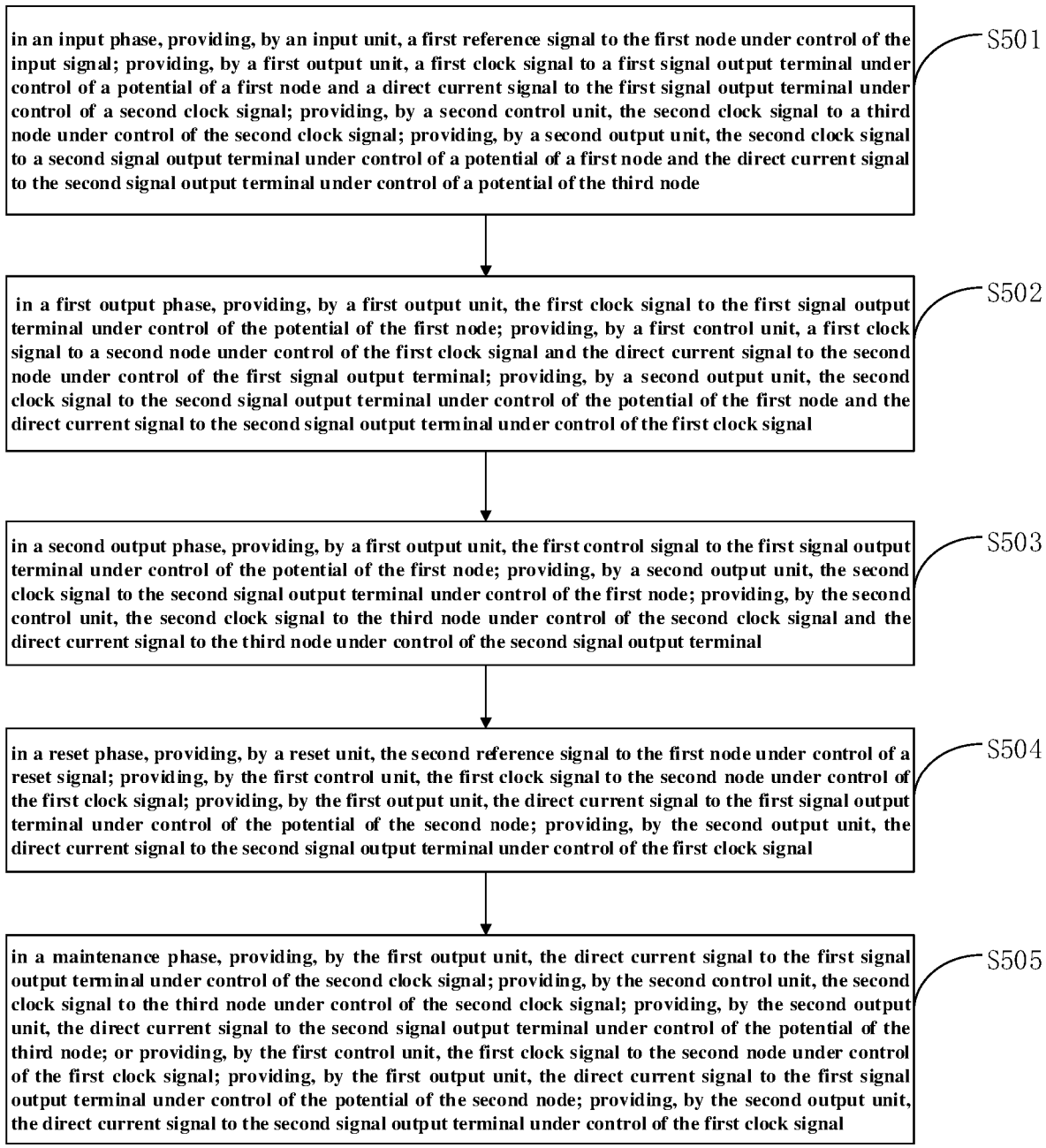
FIG. 5 is a schematic diagram of flows of a driving method of a shift register provided in an embodiment of the present disclosure.

Based on the same concept of invention, there is further provided in an embodiment of the present disclosure a driving method according to any one of the shift registers described above. As shown in FIG. 5, the method comprises:

S501: in an input phase, providing, by an input unit, a first reference signal to the first node under control of the input signal; providing, by a first output unit, a first clock signal to a first signal output terminal under control of a potential of a first node and a direct current signal to the first signal output terminal under control of a second clock signal; providing, by a second control unit, the second clock signal to a third node under control of the second clock signal; providing, by a second output unit, the second clock signal to a second signal output terminal under control of a potential of a first node and the direct current signal to the second signal output terminal under control of a potential of the third node;

S502: in a first output phase, providing, by a first output unit, the first clock signal to the first signal output terminal under control of the potential of the first node; providing, by a first control unit, a first clock signal to a second node under control of the first clock signal and the direct current signal to the second node under control of the first signal output terminal; providing, by a second output unit, the second clock signal to the second signal output terminal under control of the potential of the first node and the direct current signal to the second signal output terminal under control of the first clock signal;

S503: in a second output phase, providing, by a first output unit, the first control signal to the first signal output terminal under control of the potential of the first node; providing, by a second output unit, the second clock signal to the second signal output terminal under control of the first node; providing, by the second control unit, the second clock signal to the third node under control of the second clock signal and the direct current signal to the third node under control of the second signal output terminal;

S504: in a reset phase, providing, by a reset unit, the second reference signal to the first node A under control of a reset signal; providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal;

S505: in a maintenance phase, providing, by the first output unit, the direct current signal to the first signal output terminal under control of the second clock signal; providing, by the second control unit, the second clock signal to the third node under control of the second clock signal; providing, by the second output unit, the direct current signal to the second signal output terminal under control of the potential of the third node; or providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal.

Figure 6:
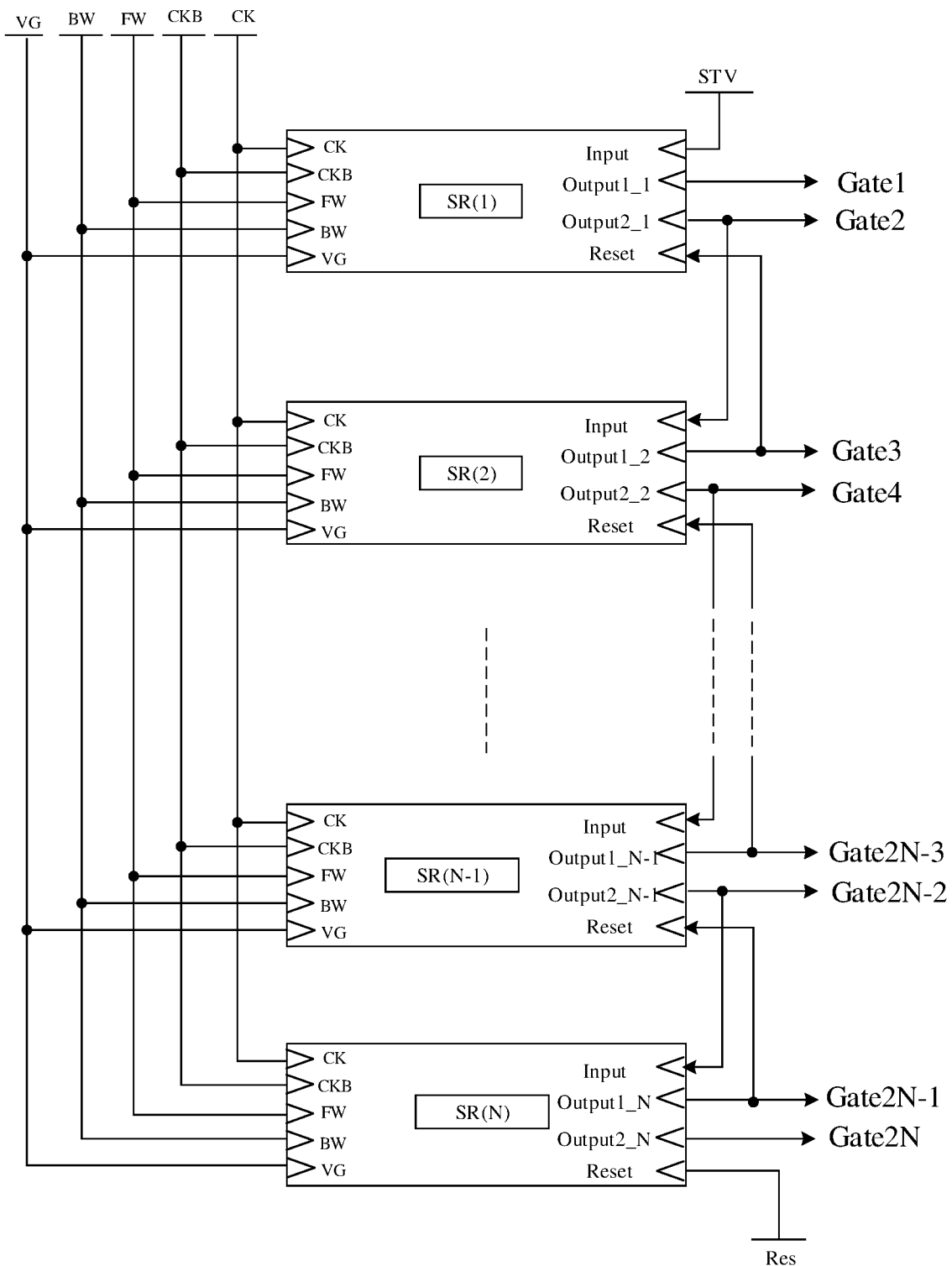
FIG. 6 is a schematic diagram of structure of a gate driving circuit provided in an embodiment of the present disclosure.

Based on a same concept of invention, there is further provided in an embodiment of the present disclosure a gate driving circuit. As shown in FIG. 6, the gate driving circuit comprises a plurality of shift registers connected in cascades provided in the embodiment of the present disclose, i.e., SR(1), SR(2), . . . , SR(n), . . . , SR(N−1), SR(N) (totally N shift registers, 1≤n≤N); wherein, except a first stage of shift register SR(1), a first signal output terminal Output1_n of each of remaining stages of shift registers SR(n) inputs a reset signal Reset to an adjacent previous stage of shift register SR(n−1) respectively;

except a last stage of shift register SR(N), a second signal output terminal Output2_n of each of remaining stages of shift registers SR(n) units inputs an input signal to an adjacent next stage of shift register SR(n+1); and the input signal Input of the first stage of shift register SR(1) is input via a frame start signal terminal STV, and a reset signal Reset of a last stage of shift register SR(N) is input via a frame end signal terminal Res.

It should be noted that the gate driving circuit provided in the embodiment of the present disclosure can realize the function of outputting progressively scanning signals to 2N gate lines by the N shift registers.

Further, in the gate driving circuit provided in the embodiment of the present disclosure, the first clock signal CK, the second clock signal CKB, the first reference signal FW, the second reference signal BW, and the direct current signal VG are input to respective stages of shift registers.

In particular, specific structure of each shift register in the gate driving circuit is the same as the function and structure of the above shift registers of the present disclosure, and thus no further description is given herein.

Further, in the gate driving circuit provided in the embodiment of the present disclosure, in the case of all the switch transistors being N type transistors: when forward scanning is performed, the first reference signal is a high potential signal, and the second reference signal is a low level signal; when backward scanning is performed, the first reference signal is a low potential signal, and the second reference signal is a high potential signal; or in the case of all the switch transistors being P type transistors: when forward scanning is performed, the first reference signal is a low potential signal, and the second reference signal is a high level signal; when backward scanning is performed, the first reference signal is a high potential signal, and the second reference signal is a low potential signal; or Operation process of the gate driving circuit provided in the embodiment of the present disclosure will be described below through a specific embodiment by taking forward scanning as an example.

Figure 7:
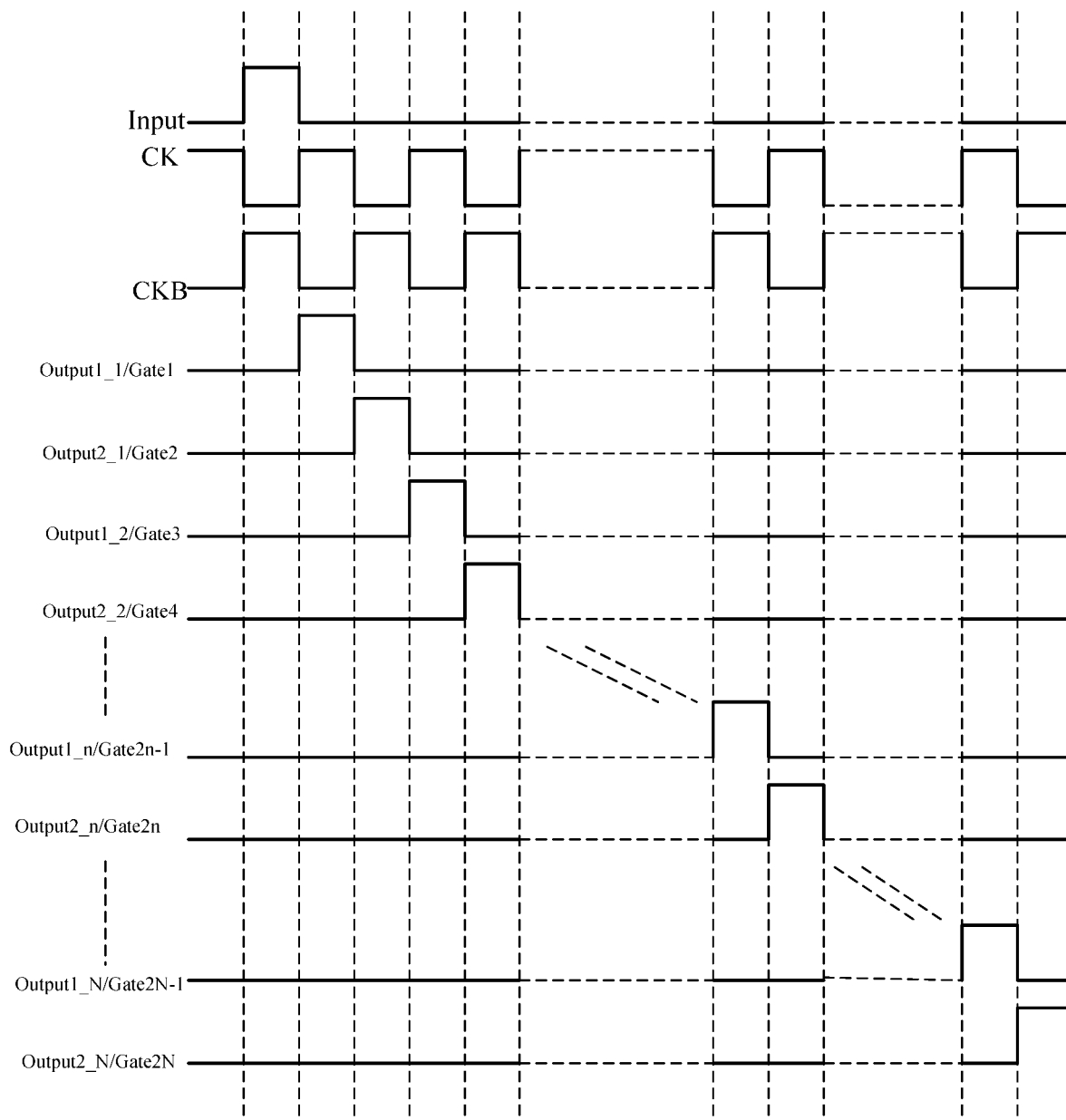
FIG. 7 is a schematic diagram of circuit timing of a gate driving circuit provided in an embodiment of the present disclosure.

By taking the gate driving circuit in FIG. 6 as an example, a first signal output terminal Output1_n of n-th stage of shift register is made connected to a (2n−1)-th gate line Gate2n−1, and a second signal output terminal Output2_n thereof is made connected to a (2n)-th gate line Gate2n. Furthermore, the specific structure of respective stages of shift registers takes the structure as shown in FIG. 3a as an example, and the operation timing diagram of the gate driving circuit is as shown in FIG. 7.

After the first stage of shift register receives an input signal, when the potential of the first clock signal CK is a high potential, a first signal output terminal Output1_1 of the first stage of shift register outputs a scanning signal to a first gate line Gate1. After that, when the potential of the second clock signal CKB becomes a high potential, a second signal output terminal Output2_1 of the first stage of shift register outputs a scanning signal to a second gate line Gate2; and this scanning signal is taken as an input signal of a second stage of shift register;

After the second stage of shift register receives an input signal, when the potential of the first clock signal CK is a high potential, a first signal output terminal Output1_2 of the second stage of shift register outputs a scanning signal to a third gate line Gate3, and as a reset signal of the first stage of shift register, this scanning signal makes the first node of the first stage of shift register be reset. After that, when the potential of the second clock signal CKB becomes a high potential, a second signal output terminal Output2_2 of the second stage of shift register outputs a scanning signal to a fourth gate line Gate4; and this scanning signal is taken as an input signal of a third stage of shift register;

By analogy, a scanning signal output by a second signal output terminal Output2_n−1 of the (n−1)-th stage of shift register to a (2n−2)-th gate line Gate2n−2 is taken as an input signal of the n-th stage of shift register. After the n-th stage of shift register receives the input signal, when the potential of the first clock signal CK becomes a high potential, the first signal output terminal Output1_n of the n-th stage of shift register outputs a scanning signal to a (2n−1)-th gate line Gate2n−2, and this scanning signal is taken as a reset signal of the (n−1)-th shift register to make the first node of the (n−1)-th stage of shift register be reset. After that, when the potential of the second clock signal CKB becomes a high potential, the second signal output terminal Output2_n of the n-th stage of shift register outputs a scanning signal to a 2n-th gate line Gate2n, and this scanning signal is taken as an input signal of the (n+1)-th stage of shift register;

After a last stage of shift register, i.e., the N-th stage of shift register, receives the input signal, when the potential of the first clock signal CK becomes a high potential, a first signal output terminal Output1_N of the N-th stage of shift register outputs a scanning signal to a (2N−1)-th gate line Gate2N−1, and this scanning signal is taken as a reset signal of a (N−1)-th stage of shift register to make a first node of the (N−1)-th stage of shift register be reset. After that, when the potential of the second clock signal CKB becomes a high potential, the second signal output terminal Output2_N of the N-th stage of shift register outputs a scanning signal to a (2N)-th gate line Gate2N, so as to realize outputting a scanning signal to 2N gate lines through N shift registers progressively.

Based on a same concept of invention, there is further provided a display apparatus in the embodiment of the present disclosure, comprising the aforesaid gate driving circuit, through which scanning signals are provided for respective gate lines on the array substrate in the display apparatus. The display apparatus can be any product or means having a function of displaying such as a mobile phone, a table computer, a television set, a display, a notebook computer, a digital photo frame, and a navigator and so on. Implementation of the display apparatus can refer to embodiments of the gate driving circuit, and thus no further description is given herein.

The shift register, the driving method thereof, the gate driving circuit and the display apparatus provided in the embodiments of the present disclosure comprise: the input unit, the reset unit, the first control unit, the second control unit, the first output unit, the second output unit, the first signal output terminal and the second signal output terminal. Herein, the input unit and the reset unit are configured to control the potential of the first node, the first control unit is configured to control the potential of the second node, and the first output unit is used to control the potential of the first signal output terminal under joint control of the first node and the second node; the second control unit is configured to control the potential of the third node, and the second output unit is used to control the potential of the second signal output terminal under joint control of the first node and the third node. That is, the input unit, the reset unit, the first control unit and the first output unit are adopted to control the potential of the first signal output terminal, and the input unit, the reset unit, the second control unit and the second output unit are adopted to control the potential of the second signal output terminal, which is equivalent to utilize the first control unit and the first output unit, the second control unit and the second output unit to control and share the input unit and the reset unit, so as to realize functions of two shift register units. Therefore, compared with the existing two shift registers, one input unit and one reset unit are omitted, so that the present disclosure has a simpler structure, occupies smaller area, and is more suitable for a design of narrow frame.

Obvious, those skilled in the art can make various alternations and modifications to the present disclosure without departing from spirit and scope of the present disclosure. As such, if these alternations and modifications of the present disclosure fall into the scope of the Claims of the present disclosure as well as their equivalent technique, then the present disclosure intends to include these alternations and modifications.

The present application claims the priority of a Chinese patent application No. 201510544007.4 filed on Aug. 28, 2015. Herein, the content disclosed by the Chinese patent application is incorporated in full by reference as a part of the present disclosure.

What is claimed is:
1. A shift register, comprising:
an input unit, whose output terminal is connected to a first node, configured to provide a first reference signal to the first node under control of an input signal;
a reset unit, whose output terminal is connected to the first node, configured to provide a second reference signal to the first node under control of a reset signal, and whose input terminal is connected to a first output terminal of a second shift register in a second stage, configured to receive a first output signal of the second shift register as the reset signal;
a first control unit, whose input terminal is connected to a first signal output terminal and output terminal is connected to a second node, configured to provide a first clock signal to the second node, and provide a direct current signal to the second node under control of a control of the first signal output terminal;
a second control unit, whose input terminal is connected to a second signal output terminal and output terminal is connected to a third node, configured to provide a second clock signal to the third node, and provide the direct current signal to the third node under control of a signal of the second signal output terminal;
a first output unit, whose one input terminal is connected to the first node and another input terminal is connected to the second node, configured to provide the first clock signal to the first signal output terminal under control of a potential of the first node, provide the direct current signal to the first signal output terminal under control of a potential of the second node, and provide the direct current signal to the first signal output terminal under control of the second clock signal; and a second output unit, whose one input terminal is connected to the first node and another input terminal is connected to the third node, configured to provide the second clock signal to the second signal output terminal under control of the potential of the first node, provide the direct current signal to the second signal output terminal under control of a potential of the third node, and provide the direct current signal to the second signal output terminal under control of the first clock signal, wherein the first signal output terminal is connected to a reset terminal of a previous shift register via a first signal line, the second signal output terminal is connected to an input terminal of the second shift register as an input signal of the second shift register via a second signal line, wherein the first signal line of the shift register does not have cross point with signal line of the second signal output terminal, and the second signal line of the shift register does not have cross point with signal line of the first signal output terminal, wherein the first clock signal and the second clock signal are opposite in phase, and a potential of the first reference signal and a potential of the second reference signal are opposite, and wherein the first control unit comprises: a third switch transistor and a fourth switch transistor; wherein
both a gate and a source of the third switch transistor are used to receive the first clock signal, and a drain thereof is connected to the second node;
a gate of the fourth switch transistor is connected to the first signal output terminal, a source thereof is used to receive the direct current signal, and a drain thereof is connected to the second node, wherein the second control unit comprises: a fifth switch transistor and a sixth switch transistor; wherein
both a gate and a source of the fifth switch transistor are used to receive the second clock signal, and a drain thereof is connected to the third node;
a gate of the sixth switch transistor is connected to the second signal output terminal, a source thereof is used to receive the direct current signal, and a drain thereof is connected to the third node, wherein in an input phase, potential of the first node is raised to a first high potential, in a first output phase, the potential of the first node is further raised to a second high potential higher than the first high potential, and in a second output phase, the potential of the first node is further raised to a third high potential higher than the second high potential.

2. The shift register according to claim 1, wherein the input unit comprises: a first switch transistor; wherein
a gate of the first switch transistor is used to receive the input signal, a source thereof is used to receive the first reference signal, and a drain thereof is connected to the first node.

3. The shift register according to claim 1, wherein the reset unit comprises a second switch transistor; wherein
a gate of the second switch transistor is used to receive the reset signal, a source thereof is used to receive the second reference signal, and a drain thereof is connected to the first node.

4. The shift register according to claim 1, wherein the first output unit comprises:

a seventh switch transistor, an eighth switch transistor, a ninth switch transistor, and a first capacitor; wherein
a gate of the seventh switch transistor is connected to the first node, a source thereof is used to receive the first clock signal, and a drain thereof is connected to the first signal output terminal;
a gate of the eighth switch transistor is connected to the second node, a source thereof is used to receive the direct current signal, and a drain thereof is connected to the first signal output terminal;
a gate of the ninth switch transistor is used to receive the second clock signal, a source thereof is used to receive the direct current signal, and a drain thereof is connected to the first signal output terminal; and
the first capacitor is connected between the first node and the first signal output terminal.

5. The shift register according to claim 1, wherein the second output unit comprises:
a tenth switch transistor, an eleventh switch transistor, a twelfth switch transistor and a second capacitor; wherein
a gate of the tenth switch transistor is connected to the first node, a source thereof is used to receive the second clock signal, and a drain thereof is connected to the second signal output terminal;
a gate of the eleventh switch transistor is connected to the third node, a source thereof is used to receive the direct current signal, and a drain thereof is connected to the second signal output terminal;
a gate of the twelfth switch transistor is used to receive the first clock signal, a source thereof is used to receive the direct current signal, and a drain thereof is connected to the second signal output terminal; and
the second capacitor is connected between the first node and the second signal output terminal.

6. The shift register according to claim 1, wherein all switch transistors are N type transistors, and a potential of the direct current signal is a high potential; or
all switch transistor are P type transistors and the potential of the direct current signal is a low potential.

7. A gate driving circuit, comprising a plurality of shift registers connected in cascades according to claim 1;
except a first stage of shift register, a first signal output terminal of each of remaining stages of shift registers inputs a reset signal to an adjacent previous stage of shift register respectively;
except a last stage of shift register, a second signal output terminal of each of remaining stages of shift registers units inputs an input signal to an adjacent next stage of shift register.

8. The gate driving circuit according to claim 7, wherein in a case of all the switch transistors being N type transistors:
when forward scanning is performed, the first reference signal is a high potential signal, and the second reference signal is a low potential signal; when backward scanning is performed, the first reference signal is a low potential signal, and the second reference signal is a high potential signal; or
in a case of all the switch transistors being P type transistors: when forward scanning is performed, a first reference signal is a low potential signal, and a second reference signal is a high potential signal; when backward scanning is performed, the first reference signal is a high potential signal, and the second reference signal is a low potential signal.

9. A display apparatus, comprising the gate driving circuit according to claim 7.

10. A driving method of a shift register according to claim 1, the method comprising:
in an input phase, providing, by the input unit, the first reference signal to the first node under control of the input signal; providing, by the first output unit, the first clock signal to the first signal output terminal under control of a potential of the first node, and the direct current signal to the first signal output terminal under control of the second clock signal; providing, by the second control unit, the second clock signal to the third node under control of the second clock signal; providing, by the second output unit, the second clock signal to the second signal output terminal under control of a potential of the first node, and the direct current signal to the second signal output terminal under control of a potential of the third node;
in a first output phase, providing, by the first output unit, the first clock signal to the first signal output terminal under control of the potential of the first node; providing, by the first control unit, the first clock signal to the second node under control of the first clock signal, and the direct current signal to the second node under control of the first signal output terminal; providing, by the second output unit, the second clock signal to the second signal output terminal under control of the potential of the first node, and the direct current signal to the second signal output terminal under control of the first clock signal;
in a second output phase, providing, by the first output unit, a first control signal to the first signal output terminal under control of the potential of the first node; providing, by the second output unit, the second clock signal to the second signal output terminal under control of the first node; providing, by the second control unit, the second clock signal to the third node under control of the second clock signal, and the direct current signal to the third node under control of the second signal output terminal;
in a reset phase, providing, by the reset unit, the second reference signal to the first node under control of the reset signal; providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal; and
in a maintenance phase, providing, by the first output unit, the direct current signal to the first signal output terminal under control of the second clock signal; providing, by the second control unit, the second clock signal to the third node under control of the second clock signal; providing, by the second output unit, the direct current signal to the second signal output terminal under control of the potential of the third node; or providing, by the first control unit, the first clock signal to the second node under control of the first clock signal; providing, by the first output unit, the direct current signal to the first signal output terminal under control of the potential of the second node; providing, by the second output unit, the direct current signal to the second signal output terminal under control of the first clock signal.

11. The gate driving circuit according to claim 7, wherein the input unit comprises: a first switch transistor; wherein
a gate of the first switch transistor is used to receive the input signal, a source thereof is used to receive the first reference signal, and a drain thereof is connected to the first node.

12. The gate driving circuit according to claim 7, wherein the reset unit comprises a second switch transistor; wherein
a gate of the second switch transistor is used to receive the reset signal, a source thereof is used to receive the second reference signal, and a drain thereof is connected to the first node.

13. The gate driving circuit according to claim 7, wherein the first output unit comprises: a seventh switch transistor, an eighth switch transistor, a ninth switch transistor, and a first capacitor; wherein
a gate of the seventh switch transistor is connected to the first node, a source thereof is used to receive the first clock signal, and a drain thereof is connected to the first signal output terminal;
a gate of the eighth switch transistor is connected to the second node, a source thereof is used to receive the direct current signal, and a drain thereof is connected to the first signal output terminal;
a gate of the ninth switch transistor is used to receive the second clock signal, a source thereof is used to receive the direct current signal, and a drain thereof is connected to the first signal output terminal; and
the first capacitor is connected between the first node and the first signal output terminal.

14. The gate driving circuit according to claim 7, wherein the second output unit comprises: a tenth switch transistor, an eleventh switch transistor, a twelfth switch transistor and a second capacitor; wherein
a gate of the tenth switch transistor is connected to the first node, a source thereof is used to receive the second clock signal, and a drain thereof is connected to the second signal output terminal;
a gate of the eleventh switch transistor is connected to the third node, a source thereof is used to receive the direct current signal, and a drain thereof is connected to the second signal output terminal;
a gate of the twelfth switch transistor is used to receive the first clock signal, a source thereof is used to receive the direct current signal, and a drain thereof is connected to the second signal output terminal; and
the second capacitor is connected between the first node and the second signal output terminal.

15. The gate driving circuit according to claim 7, wherein all switch transistors are N type transistors, and a potential of the direct current signal is a high potential; or
all switch transistor are P type transistors and the potential of the direct current signal is a low potential.

16. The display apparatus according to claim 9, wherein in a case of all the switch transistors being N type transistors: when forward scanning is performed, the first reference signal is a high potential signal, and the second reference signal is a low potential signal; when backward scanning is performed, the first reference signal is a low potential signal, and the second reference signal is a high potential signal; or in a case of all the switch transistors being P type transistors: when forward scanning is performed, a first reference signal is a low potential signal, and a second reference signal is a high potential signal; when backward scanning is performed, the first reference signal is a high potential signal, and the second reference signal is a low potential signal.

* * * * *